(12) United States Patent
Sahu et al.

(10) Patent No.: US 10,649,503 B2
(45) Date of Patent: May 12, 2020

(54) DEVICE COMPRISING COMPRESSED THERMAL INTERFACE MATERIAL (TIM) AND ELECTROMAGNETIC (EMI) SHIELD COMPRISING FLEXIBLE PORTION

(71) Applicant: QUALCOMM Incorporated, San Diego, CA (US)

(72) Inventors: Vivek Sahu, San Diego, CA (US); Mehdi Saeidi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/637,901

(22) Filed: Jun. 29, 2017

(65) Prior Publication Data
US 2019/0004571 A1    Jan. 3, 2019

(51) Int. Cl.
*G06F 1/18* (2006.01)
*H01L 23/40* (2006.01)
(Continued)

(52) U.S. Cl.
CPC .............. *G06F 1/182* (2013.01); *H01L 23/13* (2013.01); *H01L 23/147* (2013.01); *H01L 23/3735* (2013.01); *H01L 23/4006* (2013.01); *H01L 23/4334* (2013.01); *H01L 23/552* (2013.01); *H01L 24/73* (2013.01); *H05K 3/361* (2013.01); *H01L 21/56* (2013.01); *H01L 23/3675* (2013.01); *H01L 23/42* (2013.01); *H01L 25/0657* (2013.01); *H01L 25/105* (2013.01); *H01L 2224/16227* (2013.01); *H01L 2224/32225* (2013.01); *H01L 2224/48091* (2013.01); *H01L 2224/48227* (2013.01); *H01L 2224/73253* (2013.01); *H01L 2224/73265* (2013.01); *H01L 2225/0651* (2013.01); *H01L 2225/1023* (2013.01); *H01L 2225/1058* (2013.01); *H01L 2225/1094* (2013.01); *H01L 2924/1431* (2013.01);
(Continued)

(58) Field of Classification Search
None
See application file for complete search history.

(56) References Cited

U.S. PATENT DOCUMENTS 6,870,246 B1 * 3/2005 Mullen ............... H01L 23/3675
257/678
7,463,496 B2    12/2008 Robinson et al.
(Continued)

FOREIGN PATENT DOCUMENTS

WO    WO-2016182996 A1    11/2016

OTHER PUBLICATIONS

International Search Report and Written Opinion—PCT/US2018/036961—ISA/EPO—dated Sep. 24, 2018.

*Primary Examiner* — Steven B Gauthier
(74) *Attorney, Agent, or Firm* — Loza & Loza, LLP/Qualcomm

(57) ABSTRACT

A device that includes a die, a thermal interface material (TIM) coupled to the die, and an electromagnetic (EMI) shield coupled to the thermal interface material (TIM). The electromagnetic (EMI) shield is configured to compress the thermal interface material (TIM). The electromagnetic (EMI) shield comprises a flexible portion. In some implementations, the thermal interface material (TIM) is compressed by the electromagnetic (EMI) shield such that the thickness of the thermal interface material (TIM) is reduced by about at least 10~20 percent.

21 Claims, 16 Drawing Sheets

(51) Int. Cl.
    *H01L 23/13*     (2006.01)
    *H01L 23/14*     (2006.01)
    *H01L 23/373*     (2006.01)
    *H01L 23/433*     (2006.01)
    *H01L 23/552*     (2006.01)
    *H01L 23/00*     (2006.01)
    *H05K 3/36*     (2006.01)
    *H01L 25/065*     (2006.01)
    *H01L 23/42*     (2006.01)
    *H01L 25/10*     (2006.01)
    *H01L 21/56*     (2006.01)
    *H01L 23/367*     (2006.01)

(52) U.S. Cl.
    CPC ............ *H01L 2924/1434* (2013.01); *H01L 2924/15313* (2013.01); *H01L 2924/15331* (2013.01); *H01L 2924/16251* (2013.01); *H01L 2924/18161* (2013.01); *H01L 2924/3025* (2013.01)

(56) References Cited

U.S. PATENT DOCUMENTS

| | | |
|---|---|---|
| 7,692,927 B2 | 4/2010 | Jin et al. |
| 9,521,757 B2 | 12/2016 | Kyle et al. |
| 2007/0097653 A1 | 5/2007 | Gilliland et al. |
| 2009/0040731 A1* | 2/2009 | Jin .................. H01L 23/02 361/711 |
| 2017/0052575 A1 | 2/2017 | Stellman et al. |
| 2017/0117208 A1* | 4/2017 | Kasztelan ......... H01L 23/49562 |
| 2019/0057941 A1* | 2/2019 | Mescher ............ H01L 23/60 |

\* cited by examiner

PLAN VIEW

PLAN VIEW

DEVICE COMPRISING COMPRESSED THERMAL INTERFACE MATERIAL (TIM) AND ELECTROMAGNETIC (EMI) SHIELD COMPRISING FLEXIBLE PORTION

BACKGROUND

Field of the Disclosure

Various features relate generally to a device that includes a compressed thermal interface material (TIM) and an electromagnetic (EMI) shield that includes a flexible portion.

Background

FIG. 1 illustrates a package on package (PoP) device 100 that includes a first package 102 and a second package 104. The first package 102 includes a first die 120, a first package substrate 122, and a first encapsulation layer 150. The first package substrate 122 includes a first plurality of pads 124 and a first pad 126. The first die 120 is coupled to the first package substrate 122 through a first plurality of solder balls 128. Specifically, the first die 120 is coupled to the first plurality of pads 124 through the first plurality of solder balls 128. A second plurality of solder balls 136 is coupled to the first package substrate 122.

The second package 104 includes a second die 140, a second package substrate 142, a second pad 146, a third plurality of solder balls 156, and a thermal interface material (TIM) 160. The second die 140 is coupled to the second package substrate 142. The second package 104 is coupled to the first package 102 through the third plurality of solder balls 156. For example, the third plurality solder balls 156 is coupled to the first pad 126 of the first package substrate 122, and the second pad 146 of the second package 104. The thermal interface material (TIM) 160 is positioned over the second die 140. The thermal interface material (TIM) 160 is configured to help dissipate heat away from the second die 140 and towards the frame 190. The frame 190 may be the cover of a device or mid metal frame inside the device (e.g., mobile device) that includes the package on package (PoP) device 100.

As shown in FIG. 1, due to how the package on package (PoP) device 100 is placed in a device (e.g., mobile device), one or more air gaps 170 is present between the thermal interface material (TIM) 160 and a contact surface of the thermal interface material (TIM) (e.g., between the thermal interface material (TIM) 160 and the frame 190, between the thermal interface material (TIM) 160 and the second die 140). The air gaps 170 act as insulators and thus impede heat transfer, resulting in reduced heat dissipation away from the second die 140.

Therefore, there is an ongoing need for better heat dissipating of integrated devices and/or packages.

SUMMARY

Various features relate generally to a device that includes a compressed thermal interface material (TIM) and an electromagnetic (EMI) shield that includes a flexible portion.

One example provides a device that includes a die, a thermal interface material (TIM) coupled to the die, and an electromagnetic (EMI) shield coupled to the thermal interface material (TIM). The electromagnetic (EMI) shield comprises a flexible portion. The electromagnetic (EMI) shield is configured to compress the thermal interface material (TIM).

Another example provides an apparatus that includes a die, a thermal interface material (TIM) provided over the die, and a means for electromagnetic (EMI) shielding coupled to the thermal interface material (TIM). The means for electromagnetic (EMI) shielding comprises a flexible portion. The means for electromagnetic (EMI) shielding is configured to compress the thermal interface material (TIM).

Another example provides a method for fabricating a device. The method forms a thermal interface material (TIM) over a die. The method couples an electromagnetic (EMI) shield to the thermal interface material (TIM) such that the electromagnetic (EMI) shield compresses the thermal interface material (TIM). The electromagnetic (EMI) shield comprises a flexible portion.

DRAWINGS

Various features, nature and advantages may become apparent from the detailed description set forth below when taken in conjunction with the drawings in which like reference characters identify correspondingly throughout.

DETAILED DESCRIPTION

Figure 1:
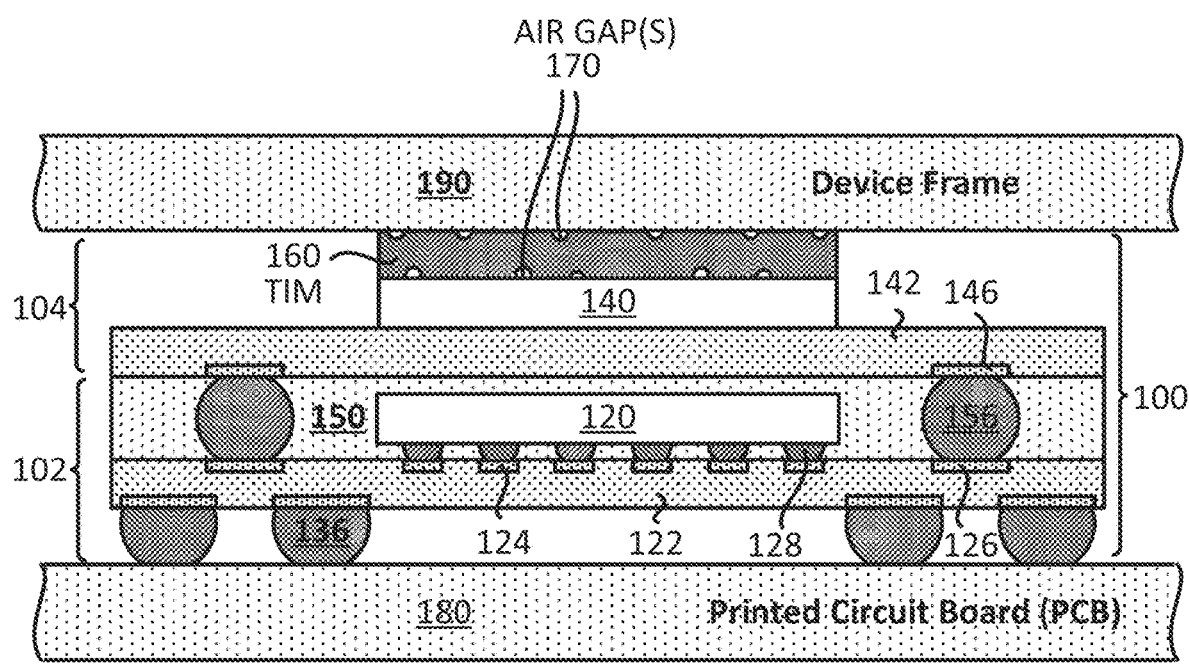
FIG. 1 illustrates a profile view of a package on package (PoP) device that includes a thermal interface material (TIM).

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Some features pertain to a device (e.g., package, package on package on package (PoP) device, side by side packages, non-PoP device) that includes a die, a thermal interface material (TIM) coupled to the die, and an electromagnetic (EMI) shield coupled to the thermal interface material (TIM). The electromagnetic (EMI) shield is configured to compress the thermal interface material (TIM). In some implementations, the electromagnetic (EMI) shield includes a flexible portion. In some implementations, the electromagnetic (EMI) shield is coupled to a pin. In some implementations, the thermal interface material (TIM) is compressed by the electromagnetic (EMI) shield such that the thickness of the thermal interface material (TIM) is reduced by about at least 10 percent (e.g., about 10-20 percent). Compression can vary based on different types of TIM used for heat transfer. In some implementations, applying a load to the thermal interface material (TIM) decreases a contact thermal resistance of the thermal interface material (TIM) with a contact surface.

In some implementations, the height of the package (e.g., package on package (PoP)) may be defined along the Z-direction of the package, which is shown in the figures of the present disclosure. In some implementations, the Z-direction of the package may be defined along an axis between a top portion and a bottom portion of the package. The terms top and bottom may be arbitrarily assigned, however as an example, the top portion of the package may be a portion comprising an encapsulation layer, while a bottom portion of the package may be a portion comprising a redistribution portion or a plurality of solder balls. In some implementations, the top portion of the package may be a back side of the package, and the bottom portion of the package may be a front side of the package. The front side of the package may be an active side of the package. A top portion may be a higher portion relative to a lower portion. A bottom portion may be a lower portion relative to a higher portion. Further examples of top portions and bottom portions will be further described below. The X-Y directions of the package may refer to the lateral direction and/or footprint of the package. Examples of X-Y directions are shown in the figures of the present disclosure and/or further described below. In many of the figures of the present disclosure, the packages and their respective components are shown across a X-Z cross-section or X-Z plane. However, in some implementations, the packages and their representative components may be represented across a Y-Z cross-section or Y-Z plane.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., data signal, ground signal, power signal). An interconnect may be part of a circuit. An interconnect may include more than one element or component.

Figure 2:
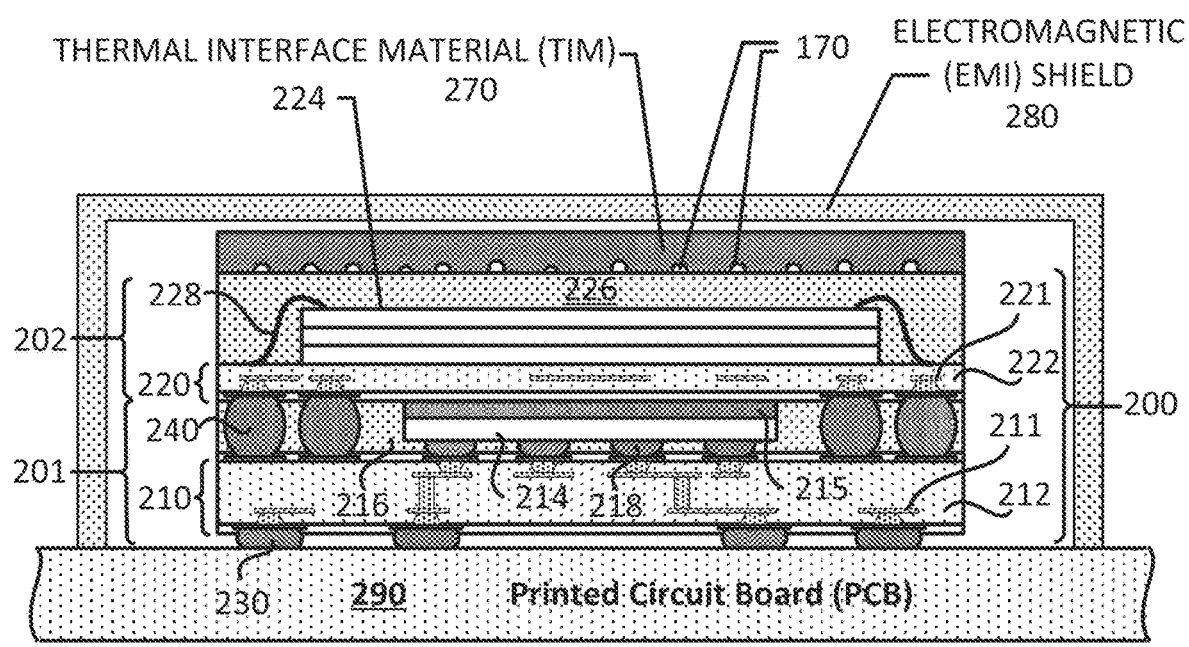
FIG. 2 illustrates a profile view of a package on package (PoP) device that includes an uncompressed thermal interface material (TIM).

Exemplary Devices Comprising a Thermal Interface Material (TIM) and an Electromagnetic (EMI) Shield FIG. 2 illustrates a package on package (PoP) device 200 that includes a first package 201, a second package 202, and a thermal interface material (TIM) 270. The second package 202 is coupled to the first package 201. The first package 201 may be a first integrated circuit (IC) package, and the second package 202 may be a second integrated circuit (IC) package. The package on package (PoP) device 200 is coupled to a printed circuit board (PCB) 290 through a plurality of solder balls 230. There is also an electromagnetic (EMI) shield 280 around the package on package (PoP) device 200. The electromagnetic (EMI) shield 280 includes stiff or rigid walls that do not bend or flex. Thus, the electromagnetic (EMI) shield 280 does not include flexible walls.

The thermal interface material (TIM) 270 is formed over the second package 202. The thermal interface material (TIM) 270 may be directly or indirectly coupled to one or more dies. In some implementations, the thermal interface material (TIM) 270 is part of the second package 202 and/or the package on package (PoP) device 200. FIG. 2 illustrates that the thermal interface material (TIM) 270 is an uncompressed thermal interface material (TIM) as it has air gaps 170 at the contact surfaces. For example, there are air gaps 170 at or around the contact surface between the thermal interface material (TIM) 270 and the second encapsulation layer 226. In the example of FIG. 2, there is also a gap between the thermal interface material (TIM) 270 and the electromagnetic (EMI) shield 280. There may be air gaps between the thermal interface material (TIM) 270 and the electromagnetic (EMI) shield 280. The thermal interface material (TIM) 270 is configured to dissipate heat away from one or more dies (e.g., dies 224). The thermal interface material (TIM) 270 has a higher thermal conductivity value than the thermal conductivity value of an encapsulation layer. In some implementations, the thermal conductivity value of the thermal interface material (TIM) 270 is about 1.0 W/mk or higher (e.g., 1.5 W/mk or higher value). However, different implementations may use a thermal interface material (TIM) with different thermal conductivity values. Examples of different types of TIMs include thermal pads, thermal grease, thermally conductive compounds, and/or gap fillers etc. The thermal interface material (TIM) 270 may be referred to as an external thermal interface material (TIM), since it is external to the package and/or the package on package (PoP) device.

The first package 201 includes a first package substrate 210, a first die 214, a thermal interface material (TIM) 218, a first encapsulation layer 216. In some implementations, the first package 201 may also include a plurality of package interconnects 240. The first die 214 is an example of an electronic package component.

The first package substrate 210 includes at least one dielectric layer 212 and a plurality of first interconnects 211 (e.g., plurality of first substrate interconnects). The plurality of first interconnects 211 may include traces, vias and/or pads. The first package substrate 210 is coupled to the printed circuit board (PCB) 290 through the plurality of solder balls 230. More specifically, the plurality of first interconnects 211 is coupled to the plurality of solder balls 230.

The first die 214 may be an integrated circuit (IC) that includes a plurality of transistors and/or other electronic components. The first die 214 may be a logic die and/or a memory die. The first die 214 may be a bare die. The first die 214 is coupled to the first package substrate 210 through the plurality of first interconnects 218.

The first encapsulation layer 216 at least partially encapsulates the first die 214, the thermal interface material (TIM) 215, and the plurality of package interconnects 240. The thermal interface material (TIM) 215 may be referred to as an internal thermal interface material (TIM), since it is located inside the package on package (PoP) device 200. Different implementations may use different materials for the first encapsulation layer 216. For example, the first encapsulation layer 216 may include a mold and/or an epoxy fill.

The second package 202 includes a second package substrate 220, a plurality of dies 224, a second encapsulation layer 226, and plurality of wire bonds 228. In some implementations, the second package 202 may also include the plurality of package interconnects 240. As mentioned above, the second package 202 may also include the thermal interface material (TIM) 270. The electromagnetic (EMI) shield 280 does not touch the thermal interface material (TIM) 270. Thus, no load or compression is applied from the electromagnetic (EMI) shield 280 to the thermal interface material (TIM) 270. Moreover, since the walls of the electromagnetic (EMI) shield 280 are not flexible, then a load that is applied to the electromagnetic (EMI) shield 280 would not be applied to the thermal interface material (TIM) 270.

The second package substrate 220 includes at least one dielectric layer 222 and a plurality of second interconnects 221 (e.g., plurality of second substrate interconnects). The plurality of second interconnects 221 may include traces, vias and/or pads.

The plurality of dies 224 may include an integrated circuit (IC) that includes a plurality of transistors and/or other electronic components. The plurality of dies 224 may include a logic die and/or a memory die. The plurality of dies 224 may include a bare die. The plurality of dies 224 is coupled to the second package substrate 220 through the plurality of wire bonds 228. The second encapsulation layer 226 at least partially encapsulates the plurality of dies 224. Different implementations may use different materials for the second encapsulation layer 226. For example, the second encapsulation layer 226 may include a mold and/or an epoxy fill.

The second package 202 is coupled to the first package 201 through the plurality of package interconnects 240. The plurality of package interconnects 240 may include a solder interconnect (e.g., solder ball). The plurality of package interconnects 240 is coupled to the first package substrate 210 and the second package substrate 220. More specifically, the plurality of package interconnects 240 is coupled to the plurality of first interconnects 211 (of the first package substrate 210) and the plurality of second interconnects 221 (of the second package substrate 220).

The present disclosure illustrates and describes interconnects (e.g., 218) being used to couple the dies (e.g., 214) to the package substrates (e.g., 210). These interconnects may be pillars and/or solder interconnects, or combination thereof. In some implementations, other interconnects may be used to couple the dies to the package substrates.

The thermal interface material (TIM) 270 may be a means for heat dissipation. As shown in FIG. 2, the thermal interface material (TIM) 270 is an uncompressed thermal interface material (TIM). As will be further described below, air gaps on one or more contact surfaces acts as insulator and increases contact resistance, which may impede heat transfer. The thermal interface material (TIM) 270 is formed over the plurality of dies 224 and the second encapsulation layer 226. In particular the thermal interface material (TIM) 270 is directly coupled to the second encapsulation layer 226, and formed over the plurality of dies 224.

Figure 3:
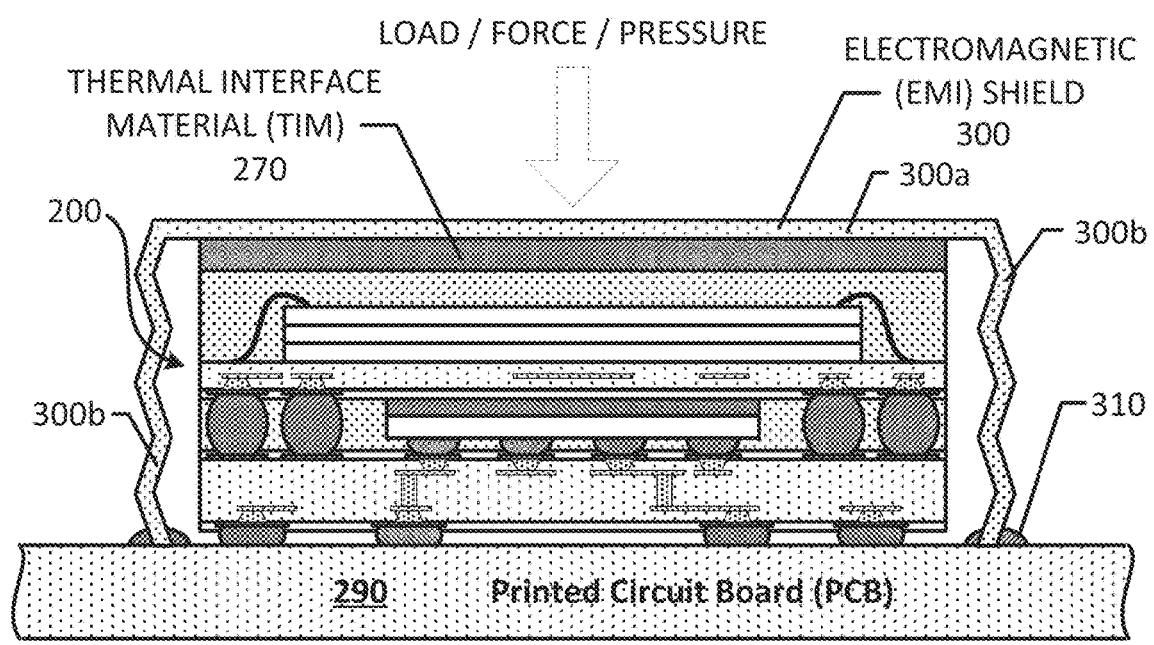
FIG. 3 illustrates a profile view of a package on package (PoP) device that includes a compressed thermal interface material (TIM) and an electromagnetic (EMI) shield.

FIG. 3 illustrates the package on package (PoP) device 200 at least partially surrounded by an electromagnetic (EMI) shield 300. The electromagnetic (EMI) shield 300 may be a means for electromagnetic (EMI) shielding. The electromagnetic (EMI) shield 300 includes a first portion 300a and a second portion 300b. The second portion 300b may be a flexible portion or collapsible portion. The second portion 300b may be a sidewall of the electromagnetic (EMI) shield 300. As shown in FIG. 3, the second portion 300b (e.g., flexible portion, vertical flexible portion) may comprise a zigzag pattern when under a load. In some implementations, when there is no load, the second portion 300b may be substantially straight. In some implementations, the first portion 300a and the second portion 300b are contiguous portions of the electromagnetic (EMI) shield 300.

The electromagnetic (EMI) shield 300 is coupled to the package on package (PoP) device 200 and the PCB 290. The electromagnetic (EMI) shield 300 is coupled to the PCB 290 through a solder 310. The electromagnetic (EMI) shield 300 is coupled to the package on package (PoP) device 200 such that the electromagnetic (EMI) shield 300 is coupled to the thermal interface material (TIM) 270. In addition, the electromagnetic (EMI) shield 300 is configured such that the electromagnetic (EMI) shield 300 (e.g., the first portion 300a of the electromagnetic (EMI) shield 300) may compress the thermal interface material (TIM) 270. As such, in some implementations, the first portion 300a has to be vertically stiff enough to compress the thermal interface material (TIM) 270. In some implementations, the electromagnetic (EMI) shield 300 may be coupled to a ground reference.

As shown in FIG. 3, when a load, force and/or pressure is applied to the electromagnetic (EMI) shield 300, the second portion 300b may flex, bend and/or or collapse. This allows the electromagnetic (EMI) shield 300 to fit better in a small device (e.g., mobile device) and accommodate different fabrication variations and/or tolerances. In some implementations, the second portion 300b may behave like a spring and have a stiffness (κ) or flexibility. The stiffness (κ) can be quantified as load (F) over displacement (δ) (κ=F/δ). A load may be a pressure and/or a force. The load, force and/or pressure may come from a frame of a device (e.g., frame of a mobile device), other mechanisms and/or other sources. However, the load, pressure and/or force may be applied differently. Examples of how load may be applied are further described in FIGS. 6 and 7. Displacement may be defined as the amount of change in the height of the spring or the change in the height of the flexible portion (e.g., second portion 300b) of the electromagnetic (EMI) shield 300. In some implementations, displacement may be defined by how much the thermal interface material (TIM) is compressed.

In some implementations, the electromagnetic (EMI) shield 300 is configured such that the electromagnetic (EMI) shield 300 can accommodate a load (F) in a range of about 2-90 Newtons (N) and a displacement (δ) in a range of about 50-500 micrometers (μm) (e.g., about 0.00005-0.0005 meter (m)). In some implementations, the electromagnetic (EMI) shield 300 (e.g., the flexible portion of the electromagnetic (EMI) shield 300) has a stiffness (κ) (e.g., stiffness along vertical direction, vertical stiffness) in a range of about 40,000-180,000 Newtons/meter (N/m). However, different implementations may use different stiffness, load and displacement configurations.

As mentioned above, the electromagnetic (EMI) shield 300 is coupled to the thermal interface material (TIM) 270 such that the electromagnetic (EMI) shield 300 applies a load, force and/or pressure to the thermal interface material (TIM) 270 and compresses the thermal interface material (TIM) 270. Different implementations may provide different loads to the thermal interface material (TIM) 270 and compress the thermal interface material (TIM) 270 differently. It is noted that as used in the disclosure, when a load is applied by the electromagnetic (EMI) shield 300 to the thermal interface material (TIM) 270, it may mean that a load is applied to the thermal interface material (TIM) 270 through the electromagnetic (EMI) shield 300. Thus, the electromagnetic (EMI) shield 300 may be applying the load directly or indirectly to the thermal interface material (TIM) 270.

In some implementations, the electromagnetic (EMI) shield 300 is configured to provide or apply a load of about at least about ≥5 PSI to the thermal interface material (TIM) 270. In some implementations, the electromagnetic (EMI) shield 300 is configured to provide or apply a load of at least about 15 PSI to the thermal interface material (TIM) 270. In some implementations, the electromagnetic (EMI) shield 300 is configured to provide or apply a load between about 5-15 PSI to the thermal interface material (TIM) 270. Different loads may be applied for different thermal interface materials (TIMs).

In some implementations, the electromagnetic (EMI) shield 300 is configured to compress the thickness of the thermal interface material (TIM) 270 by about 10 to 20 percent. The thickness of different thermal interface materials (TIMs) may be reduced differently. In some implementations, a load is applied to the thermal interface material (TIM) 270 such that the compressed thermal interface material (TIM) 270 comprises a thickness of about 30-100 micrometers (μm).

Applying load and compressing the thermal interface material (TIM) 270 provides several technical advantages. One, it eliminates, minimizes, or reduces any air gaps that may have previously been present. As mentioned above, an air gap acts as a heat insulator. Thus, by at least reducing, minimizing, or eliminating air gaps between the thermal interface material (TIM) 270 and a contact surface (e.g., surface between the thermal interface material (TIM) 270 and the electromagnetic (EMI) shield 300, surface between thermal interface material (TIM) 270 and the second encapsulation layer 226), improved heat dissipation of the dies is achieved. Two, compressing the thermal interface material (TIM) 270 increases the density of the thermal interface material (TIM) 270, which in turns increases the effectiveness or efficiency of the thermal interface material (TIM) in dissipating heat. Three, as mentioned above, applying a load and/or compression helps reduce contact resistance between different materials and/or components. The reduction of the contact resistance between the thermal interface material (TIM) 270 and the electromagnetic (EMI) shield 300 and/or the second encapsulation layer 226 (or any other material in contact with the thermal interface material (TIM) 270) improves the effectiveness or efficiency of the thermal interface material (TIM) in dissipating heat. In some implementations, the improved heat transfer, from compression of the thermal interface material (TIM), may result in the die temperature and/or junction temperature to be reduced by about 10 degrees Celsius or more, relative to using an uncompressed thermal interface material (TIM).

It is noted that too much load to the thermal interface material (TIM) 270 is not desirable because it can lead to too much pressure to the other electronic components of the package or package (PoP) device 200. For example, too much load may crack some of the dies and/or substrates of the package on package (PoP) device 200. Thus, the proper amount of load must be applied in order to optimize heat dissipation, while at the same time maintaining the reliability of the package or package (PoP) device 200. Moreover, in some implementations, after a particular amount of load is applied to the thermal interface material (TIM), additional load may not provide improved heat transfer efficiency of the thermal interface material (TIM). In some implementations, the proper amount of load that is applied can be controlled by the use of an electromagnetic (EMI) shield 300 (e.g., the flexible portion of the electromagnetic (EMI) shield 300) that has a stiffness (κ) (e.g., stiffness along vertical direction, vertical stiffness) in a range of about 40,000-180,000 Newtons/meter (N/m). In some implementations, a stiffness that is too low may result in too much compression of the thermal interface material (TIM), while a stiffness that is too high may result in not enough compression on the thermal interface material (TIM).

Another technical advantage of the configuration shown in FIG. 3 is the use of an existing component to provide an additional function. FIG. 3 illustrates the electromagnetic (EMI) shield 300 is configured to provide electromagnetic (EMI) shielding (e.g., radio frequency (RF) shielding) and to provide compression of the thermal interface material (TIM) 270.

To provide the proper amount of load and compression, a coupling structure or mechanism (e.g., coupling means, means for coupling) may be used with the electromagnetic (EMI) shield 300. Different coupling structures are illustrated and described in FIGS. 6-7. These different coupling structures are designed to provide more load and compression than the use of only solder interconnects.

Figure 4:
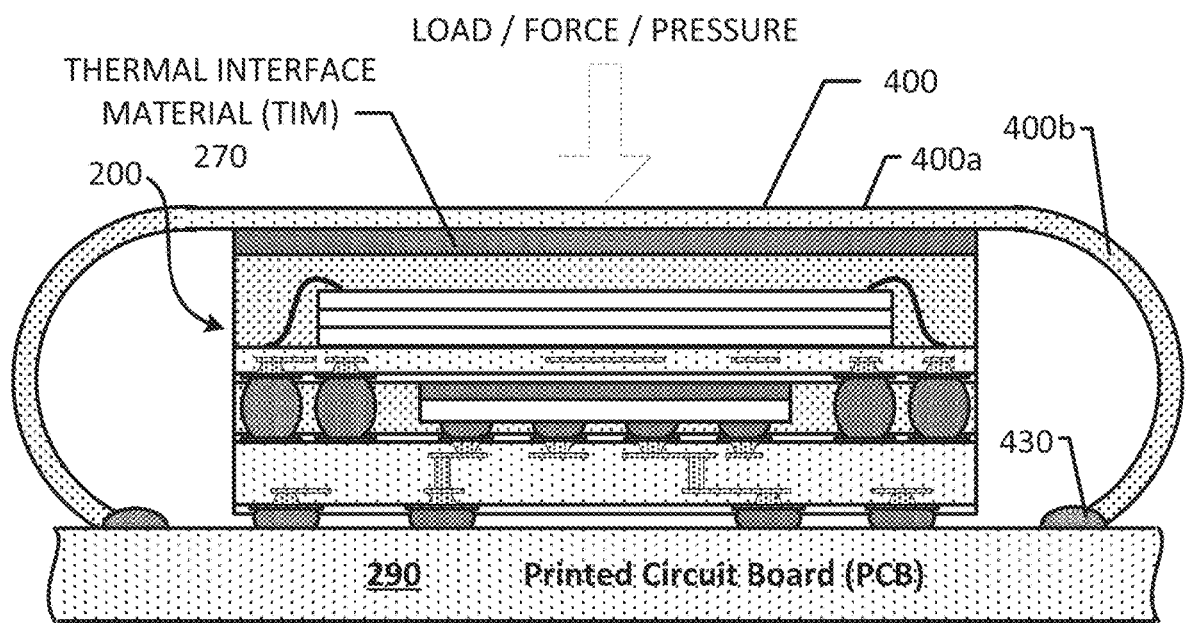
FIG. 4 illustrates a profile view of a package on package (PoP) device that includes a compressed thermal interface material (TIM) and an electromagnetic (EMI) shield.

FIG. 4 illustrates an electromagnetic (EMI) shield 400 (e.g., means for electromagnetic (EMI) shielding) that at least partially surrounds the package on package (PoP) device 200. The electromagnetic (EMI) shield 400 is similar to the electromagnetic (EMI) shield 300 of FIG. 3. The electromagnetic (EMI) shield 400 includes a first portion 400a and a second portion 400b.

The second portion 400b may be a flexible portion or collapsible portion. The second portion 400b may be a sidewall of the electromagnetic (EMI) shield 400. As shown in FIG. 4, the second portion 400b (e.g., flexible portion) may comprise a curved pattern when under a load. In some implementations, when there is no load, the second portion 400b may be substantially straight or slightly less curved. In some implementations, the first portion 400a and the second portion 400b are contiguous portions of the electromagnetic (EMI) shield 400. The first portion 400a may also be flexible in some implementations.

The electromagnetic (EMI) shield 400 is similar to the electromagnetic (EMI) shield 300 in that it compresses the thermal interface material (TIM) 270 and provides electromagnetic (EMI) shielding (e.g., radio frequency (RF) shielding). In some implementations, the electromagnetic (EMI) shield 400 is configured such that the electromagnetic (EMI) shield 400 (e.g., the first portion 400a of the electromagnetic (EMI) shield 400) may compress the thermal interface material (TIM) 270. As such, in some implementations, the first portion 400a has to be vertically stiff enough to compress the thermal interface material (TIM) 270. The electromagnetic (EMI) shield 400 may have similar stiffness, load and displacement configurations as described for the electromagnetic (EMI) shield 300. Different implementations may provide the electromagnetic (EMI) shield 400 with different shapes and/or sizes. In some implementations, the electromagnetic (EMI) shield 400 may be coupled to a ground reference.

Figure 5:
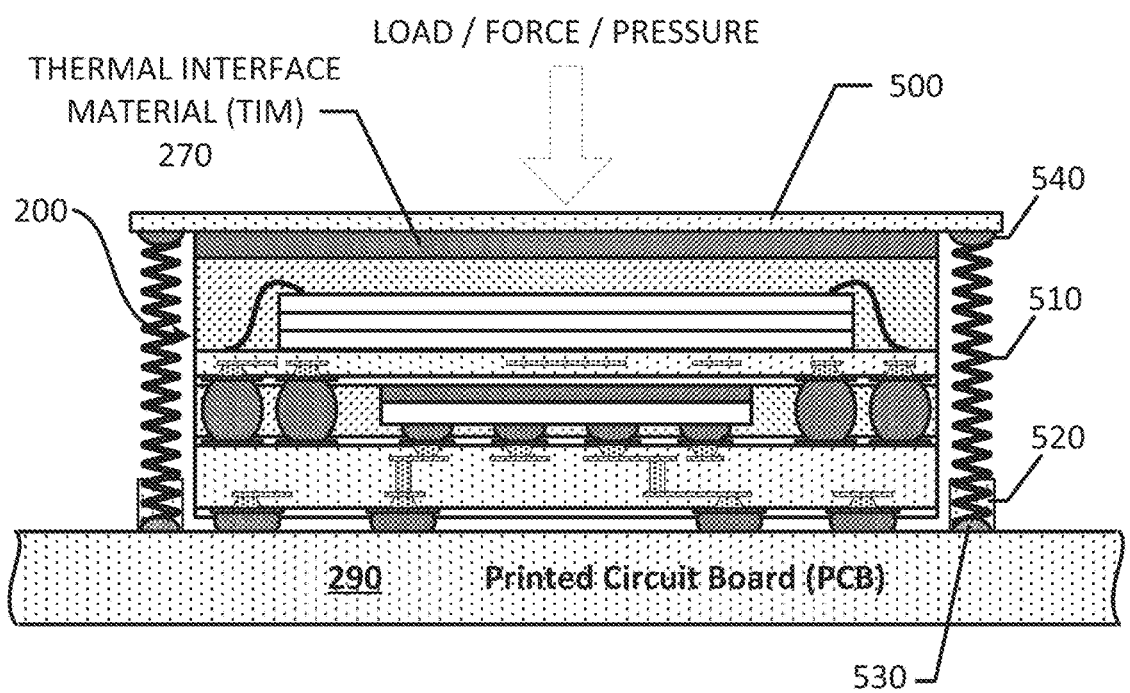
FIG. 5 illustrates a profile view of a package on package (PoP) device that includes a compressed thermal interface material (TIM) and an electromagnetic (EMI) shield.

FIG. 5 illustrates an electromagnetic (EMI) shield 500 (e.g., means for electromagnetic (EMI) shielding) that at least partially surrounds the package on package (PoP) device 200. FIG. 5 illustrates the electromagnetic (EMI) shield 500 coupled to the PCB 290 through the use of at least one spring 510, a latch 520, a solder 530 and a solder 540. In some implementations, the at least one spring 510 (e.g., vertical spring) may be part of the electromagnetic (EMI) shield 500. In some implementations, the electromagnetic (EMI) shield 500 is coupled to a ground reference through the at least one spring 510.

The electromagnetic (EMI) shield 500 operates in a similar manner as the electromagnetic (EMI) shield 300 and the electromagnetic (EMI) shield 400, in that the electromagnetic (EMI) shield 500 compresses the thermal interface material (TIM) 270 and provides electromagnetic (EMI) shielding (e.g., radio frequency (RF) shielding). In some implementations, the electromagnetic (EMI) shield 500 has to be vertically stiff enough to compress the thermal interface material (TIM) 270. The at least one spring 510 provide flexibility and stiffness as described for the electromagnetic (EMI) shield 300. In some implementations, the at least one spring 510 of the electromagnetic (EMI) shield 500 is configured such that the at least one spring and/or the electromagnetic (EMI) shield 500 can accommodate a load (F) in a range of about 2-90 Newtons (N) and a displacement ($\delta$) in a range of about 50-500 micrometers ($\mu$m) (e.g., about 0.00005-0.0005 meter (m)). In some implementations, the electromagnetic (EMI) shield 500 (e.g., spring 510) has a stiffness ($\kappa$) (e.g., stiffness along vertical direction, vertical stiffness) in a range of about 40,000-180,000 Newtons/meter (N/m). However, different implementations may use different stiffness, load and displacement configurations.

As shown in FIG. 5, the at least one spring 510 is coupled to the electromagnetic (EMI) shield 500 through the solder 540. The at least one spring 510 is coupled to the PCB 290 through the latch 520 and/or the solder 530. In some implementations, the latch 520 is coupled to the PCB 290. Part of the at least one spring 510 may be located inside the latch 520. It is noted that the electromagnetic (EMI) shield 500 may be flexible in some implementations.

Figure 6:
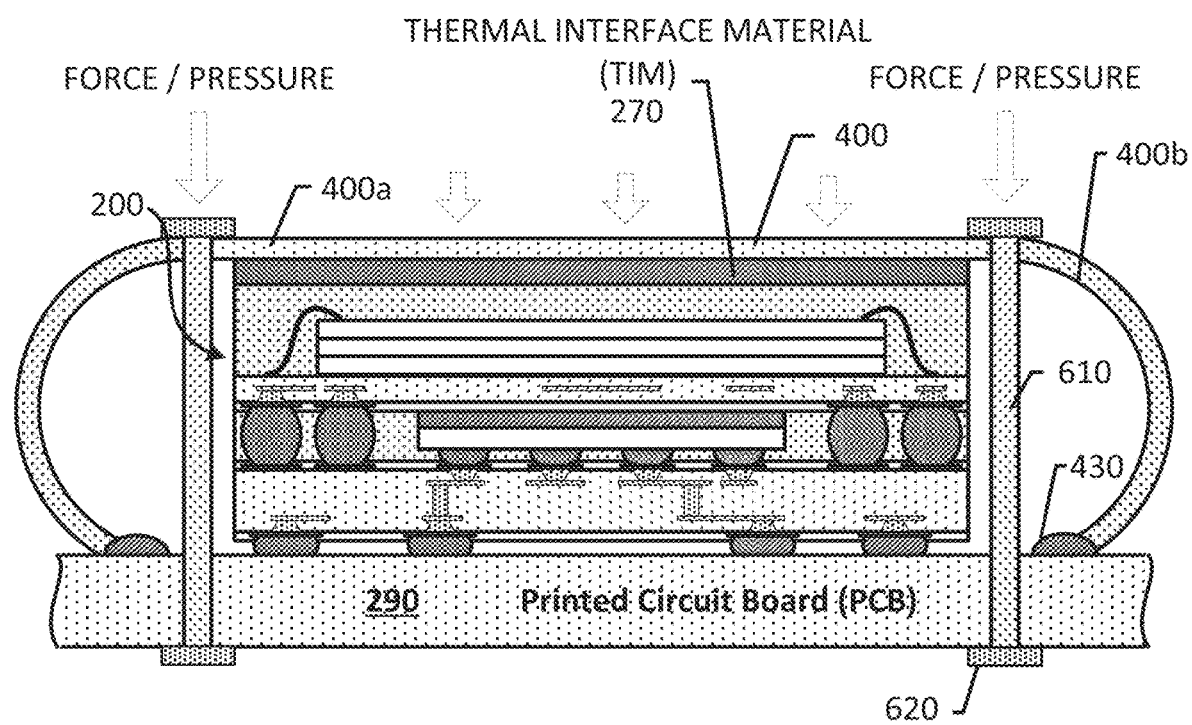
FIG. 6 illustrates a profile view of a package on package (PoP) device that includes a compressed thermal interface material (TIM) and an electromagnetic (EMI) shield.

FIG. 6 illustrates the electromagnetic (EMI) shield 400 (e.g., means for electromagnetic (EMI) shielding) that at least partially surrounds the package on package (PoP) device 200. The configuration of the electromagnetic (EMI) shield 400 of FIG. 6 is similar to the configuration of the electromagnetic (EMI) shield 400 of FIG. 4. The electromagnetic (EMI) shield 400 is held down by at least one pin 610 and at least one nut 620. The at least one pin 610 passes through the electromagnetic (EMI) shield 400 and the PCB 290. The pin 610 may be a push pin. In some implementations, the pin 610 may include a screw, a bolt, and/or a nut.

The at least one pin 610 and the at least one nut 620 help provide a load to the electromagnetic (EMI) shield 400, which in turns provides a load to the thermal interface material (TIM) 270. In some implementations, the at least one pin 610 and the at least one nut 620 provide a more precise or configurable load on the electromagnetic (EMI) shield 400 and thus provides better control of how much load or compression to apply to the thermal interface material (TIM) 270.

Figure 7:
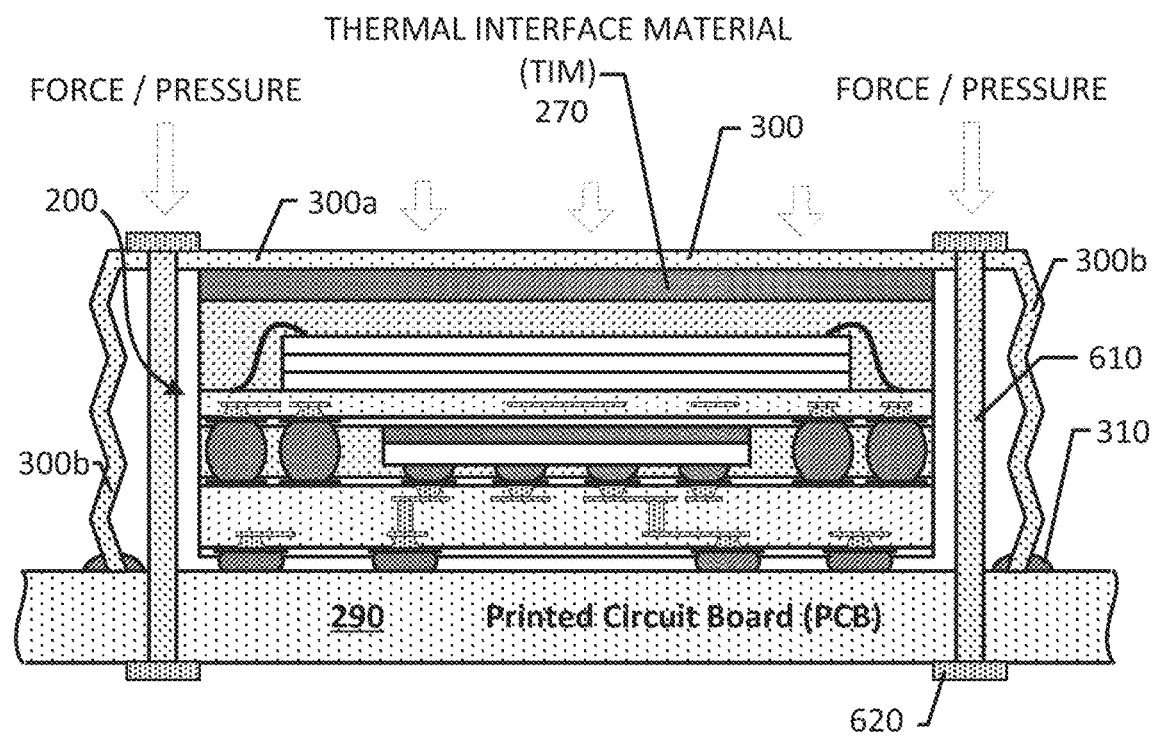
FIG. 7 illustrates a profile view of a package on package (PoP) device that includes a compressed thermal interface material (TIM) and an electromagnetic (EMI) shield.

FIG. 7 illustrates an electromagnetic (EMI) shield 300 (e.g., means for electromagnetic (EMI) shielding) that at least partially surrounds the package on package (PoP) device 200. The configuration of the electromagnetic (EMI) shield 300 of FIG. 7 is similar to the configuration of the electromagnetic (EMI) shield 300 of FIG. 3. The electromagnetic (EMI) shield 300 is held down by at least one pin 610 and at least one nut 620. The at least one pin 610 passes through the electromagnetic (EMI) shield 400 and the PCB 290. The pin 610 may be a push pin. In some implementations, the pin 610 may include a screw, a bolt, and/or a nut.

The at least one pin 610 and the at least one nut 620 help provide a load to the electromagnetic (EMI) shield 300, which in turns provides a load to the thermal interface material (TIM) 270. In some implementations, the at least one pin 610 and the at least one nut 620 provide a more precise or configurable load on the electromagnetic (EMI) shield 400 and thus provides better control of how much load or compression to apply to the thermal interface material (TIM) 270. One advantage of the pin and the nut combination is that when the pin is bonded to the electromagnetic (EMI) shield, the pin may help prevent too much compression of the thermal interface material (TIM), since the pin is much stiffer than the flexible portion of the electromagnetic (EMI) shield. Thus, while a load may be strong enough to compress the flexible portion of the electromagnetic (EMI) shield, the load may not be enough strong enough to bend the pin. As such, the pin may act as a backstop that prevents additional compression due to an external load. It is noted that a pin and a nut is merely an example of components that can provide a load on the electromagnetic (EMI) shield. Different implementations may use other components and/or mechanisms to provide a load on the electromagnetic (EMI) shield.

Different implementations may use different designs, shapes and/or materials for the electromagnetic (EMI) shields (e.g., 300, 400, 500) described in the present disclosure. In some implementations, the electromagnetic (EMI) shield is made of an electrically conductive material (e.g., metal, alloy etc.). The electromagnetic (EMI) shield may be made of one or more metal sheet(s) formed (e.g., bent, cut, perforated) to a particular shape. The electromagnetic (EMI) shield (e.g., 300, 400, 500) may be electrically coupled to the PCB and/or other components.

Figure 8:
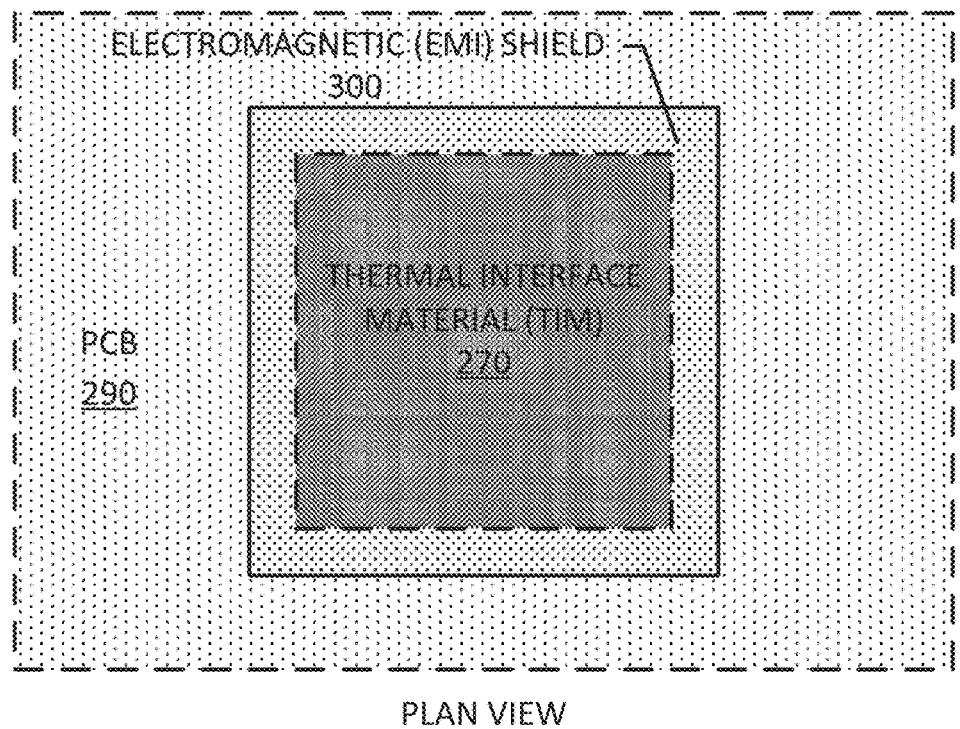
FIG. 8 illustrates a plan view of a package on package (PoP) device that includes a compressed thermal interface material (TIM) and an electromagnetic (EMI) shield.
Figure 9:
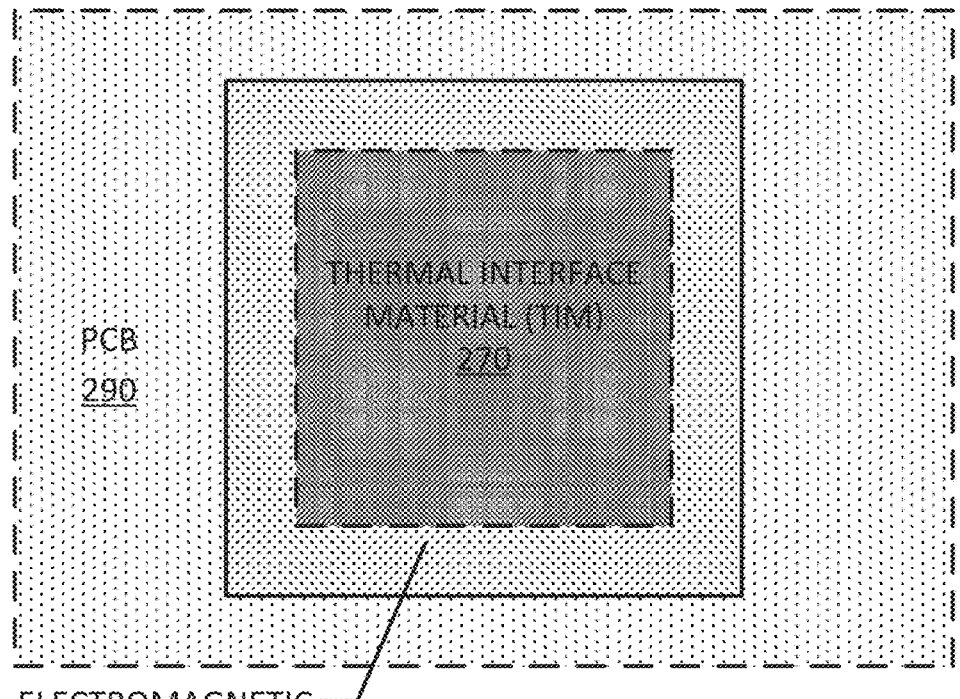
FIG. 9 illustrates a plan view of a package on package (PoP) device that includes a compressed thermal interface material (TIM) and an electromagnetic (EMI) shield.
Figure 10:
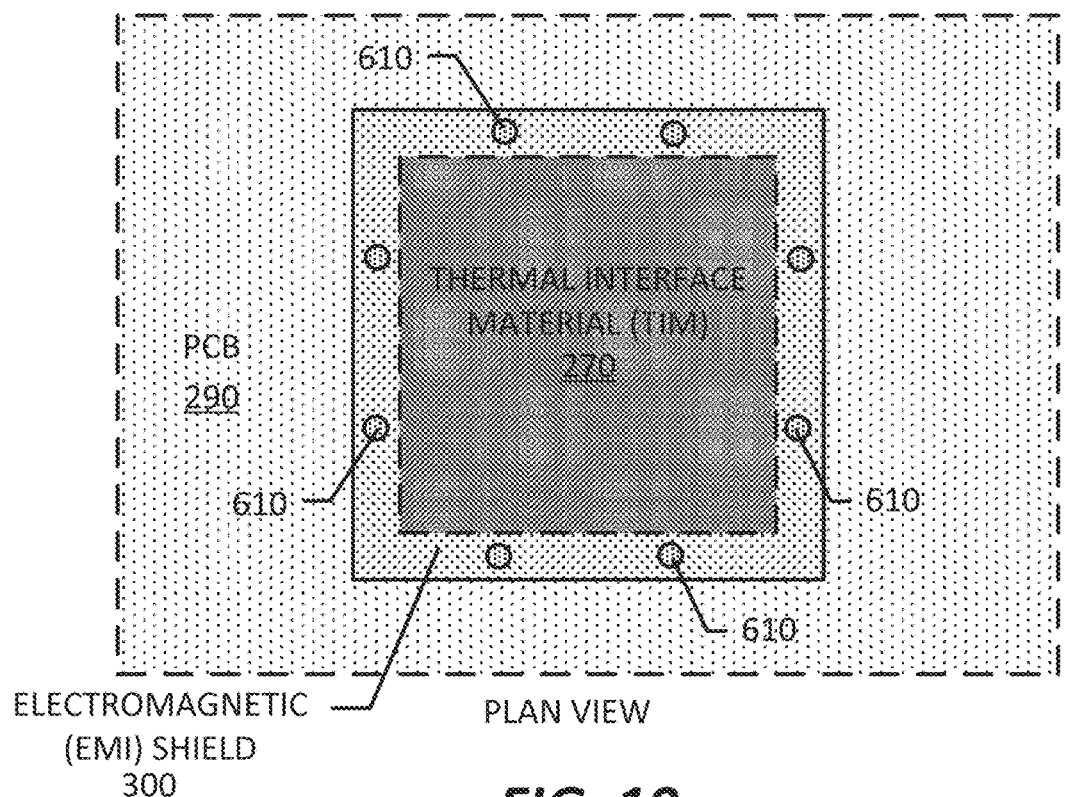
FIG. 10 illustrates a plan view of a package on package (PoP) device that includes a compressed thermal interface material (TIM) and an electromagnetic (EMI) shield.
Figure 11:
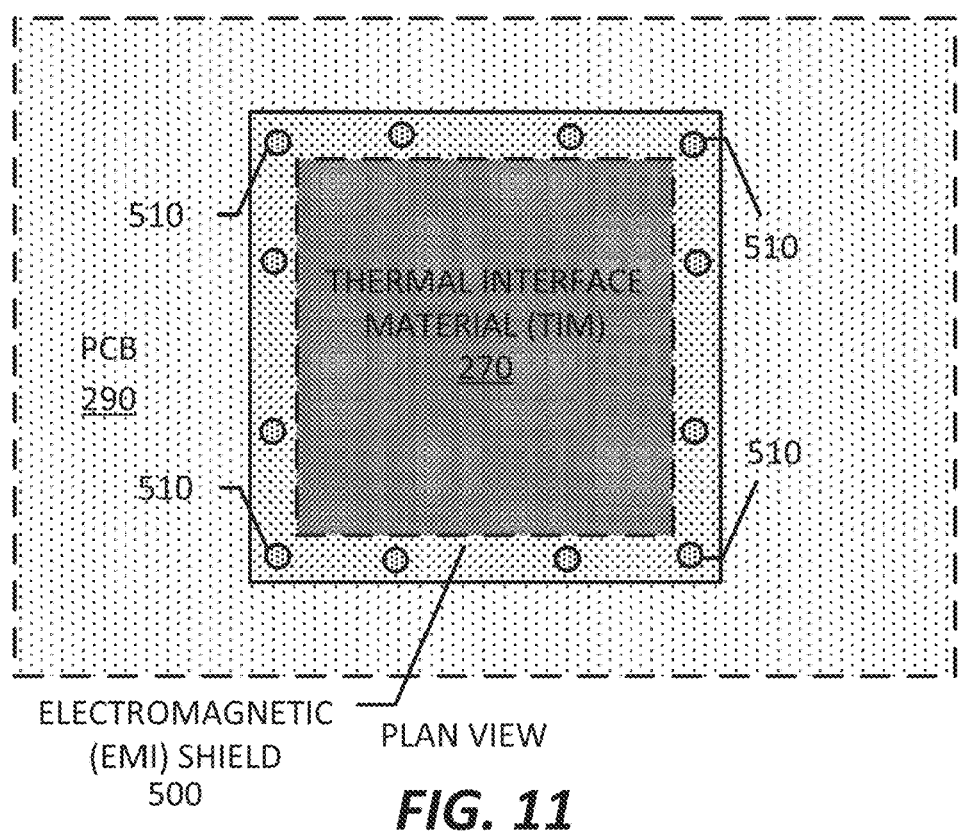
FIG. 11 illustrates a plan view of a package on package (PoP) device that includes a compressed thermal interface material (TIM) and an electromagnetic (EMI) shield.

FIGS. 8-11 illustrate plan views of the various packages with a compressed thermal interface material (TIM) and an electromagnetic (EMI) shield. FIG. 8 illustrates a plan view (e.g., top view) of the package on package (PoP) device 200, the thermal interface material (TIM) 270, and the electromagneti3 (EMI) shield 300 from FIG. 3. FIG. 9 illustrates a plan view (e.g., top view) of the package on package (PoP) device 200, the thermal interface material (TIM) 270, and the electromagnetic (EMI) shield 300 from FIG. 4. FIG. 10 illustrates a plan view (e.g., top view) of another package on package (PoP) device 200, the thermal interface material (TIM) 270, the electromagnetic (EMI) shield 300 and the at least one pin 610 from FIG. 7. FIG. 11 illustrates a plan view (e.g., top view) of the package on package (PoP) device 200, the thermal interface material (TIM) 270, the electromagnetic (EMI) shield 500, and the at least one spring 510 from FIG. 5.

It is noted that different implementations may have different designs, shapes and sizes for the electromagnetic (EMI) shield (e.g., 300, 400, 500). The electromagnetic (EMI) shield may be unibody or made up of several layers, parts and/or components. The electromagnetic (EMI) shield may be contiguous or have separate parts. The electromagnetic (EMI) shield may have cavities.

FIGS. 3-5 illustrate the thermal interface material (TIM) 270 is formed over a die but directly coupled to an encapsulation layer. In some implementations, the thermal interface material (TIM) 270 may be coupled (e.g., directly coupled) to a die.

Figure 12:
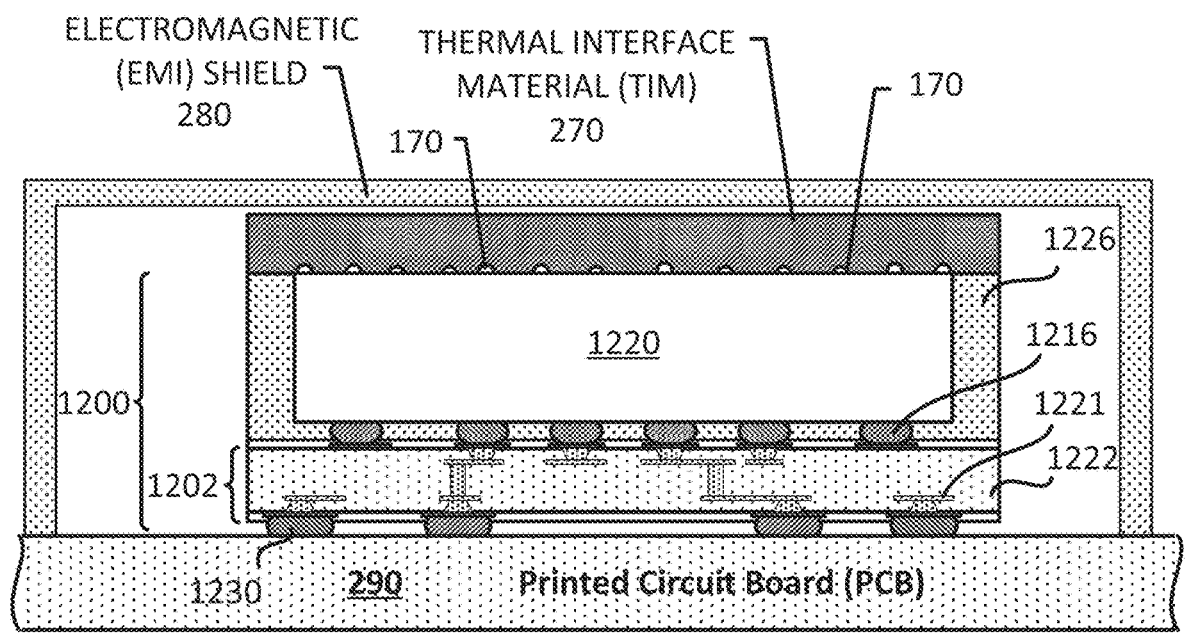
FIG. 12 illustrates a profile view of a package that includes an uncompressed thermal interface material (TIM).

Exemplary Devices Comprising a Thermal Interface Material (TIM) and an Electromagnetic (EMI) Shield FIG. 12 illustrates package 1200 that includes a package substrate 1202, a die 1220, an encapsulation layer 1226, and plurality of solder interconnects 1216. The package 1200 may also include the thermal interface material (TIM) 270. The thermal interface material (TIM) 270 is coupled and formed over the die 1220. In FIG. 12, the thermal interface material (TIM) 270 is an uncompressed thermal interface material (TIM) 270. The package 1200 is coupled to the PCB 290 through the plurality of solder interconnects 1230. There is also an electromagnetic (EMI) shield 280 around the package 1200. The electromagnetic (EMI) shield 280 includes stiff or rigid walls that do not bend or flex. Thus, the electromagnetic (EMI) shield 280 does not include flexible walls. There may be air gaps between the thermal interface material (TIM) 270 and the electromagnetic (EMI) shield 280. In FIG. 12, there is a space or gap between the electromagnetic (EMI) shield 280 and the thermal interface material (TIM) 270. Thus, the electromagnetic (EMI) shield 280 does not provide a force or load on the thermal interface material (TIM) 270, since the electromagnetic material (TIM) 270 has stiff or rigid walls.

The package 1200 may be an integrated circuit (IC) package. The package substrate 1202 includes at least one dielectric layer 1222 and a plurality of interconnects 1221 (e.g., plurality of substrate interconnects). The plurality of interconnects 1221 may include traces, vias and/or pads.

The die 1220 may include an integrated circuit (IC) that includes a plurality of transistors and/or other electronic components. The die 1220 may include a logic die and/or a memory die. The die 1220 may include a bare die. The die 1220 is coupled to the second package substrate 1020 through the plurality of solder interconnects 1216. The encapsulation layer 1226 at least partially encapsulates the die 1220. Different implementations may use different materials for the encapsulation layer 1226. For example, the encapsulation layer 1226 may include a mold and/or an epoxy fill.

Figure 13:
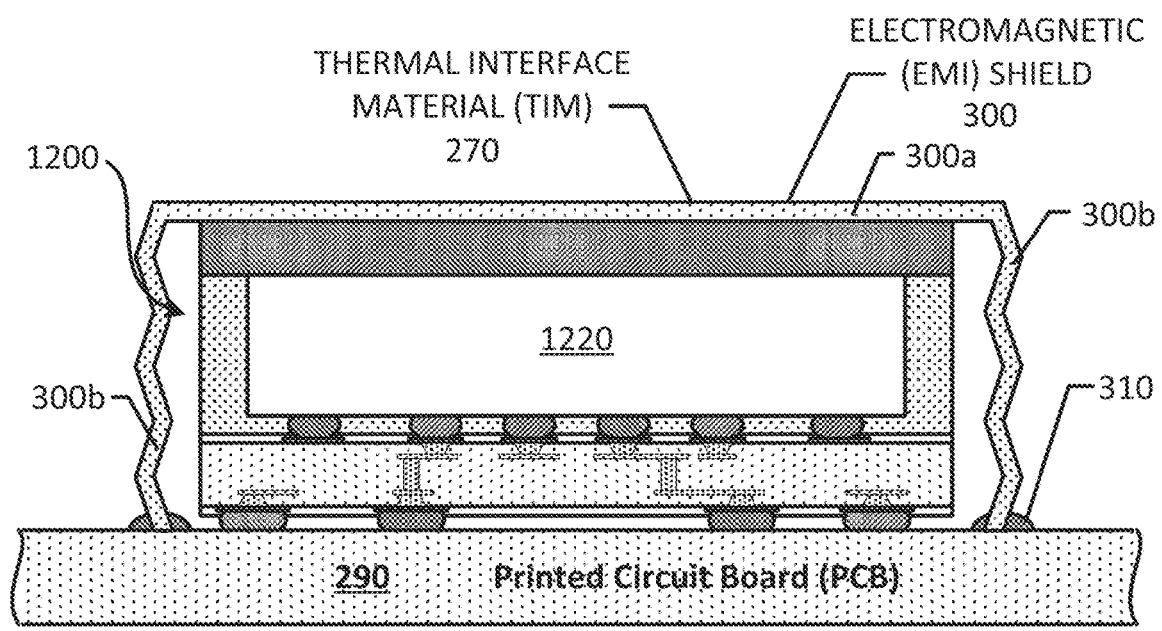
FIG. 13 illustrates a profile view of a package that includes a compressed thermal interface material (TIM) and an electromagnetic (EMI) shield.

FIG. 13 illustrates the electromagnetic (EMI) shield 300 (e.g., means for electromagnetic (EMI) shielding) that at least partially surrounds the package 1200. FIG. 13 illustrates the package 1200 at least partially surrounded by an electromagnetic (EMI) shield 300. The electromagnetic (EMI) shield 300 includes a first portion 300a and a second portion 300b. The second portion 300b may be a flexible portion or collapsible portion. The second portion 300b may be a sidewall of the electromagnetic (EMI) shield 300. As shown in FIG. 13, the second portion 300b (e.g., flexible portion) may comprise a zigzag pattern when under a load. In some implementations, when there is no load, the second portion 300b may be substantially straight. In some implementations, the first portion 300a and the second portion 300b are contiguous portions of the electromagnetic (EMI) shield 300. In some implementations, the first portion 300a may also be flexible.

The electromagnetic (EMI) shield 300 apply a load and compress the thermal interface material (TIM) 270 of the package 1200 in a similar manner as described in FIG. 3.

Figure 14:
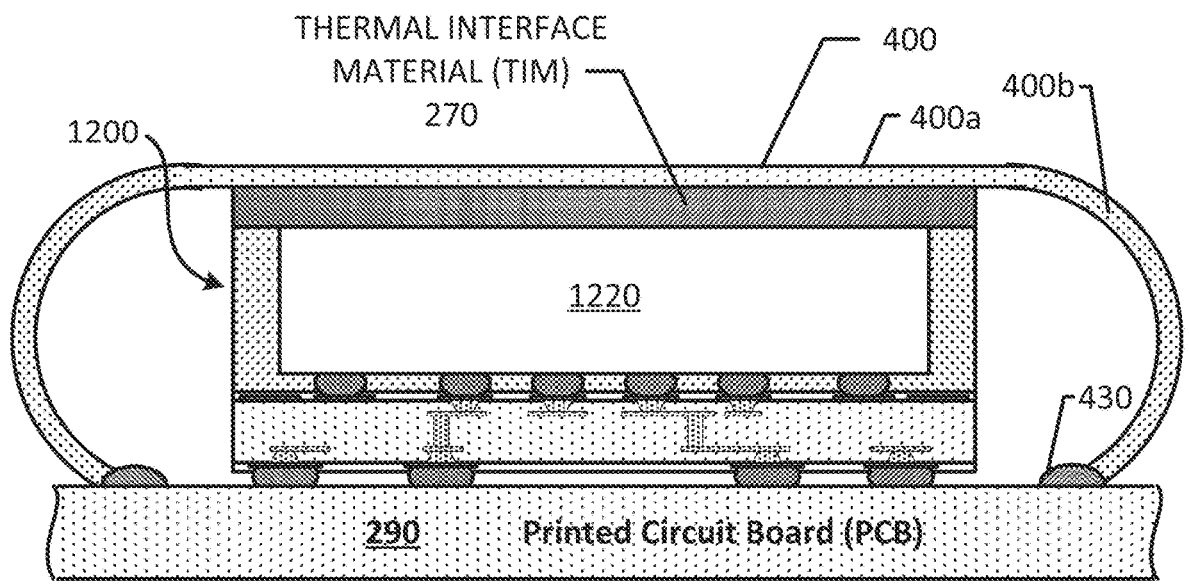
FIG. 14 illustrates a profile view of a package that includes a compressed thermal interface material (TIM) and an electromagnetic (EMI) shield.

FIG. 14 illustrates an electromagnetic (EMI) shield 400 (e.g., means for electromagnetic (EMI) shielding) that at least partially surrounds the package 1200. FIG. 14 illustrates the package 1200 at least partially surrounded by an electromagnetic (EMI) shield 400. The electromagnetic (EMI) shield 400 includes a first portion 400a and a second portion 400b. The second portion 400b may be a flexible portion or collapsible portion. The second portion 400b may be a sidewall of the electromagnetic (EMI) shield 300. As shown in FIG. 14, the second portion 400b (e.g., flexible portion) may comprise a curved pattern when under a load. In some implementations, when there is no load, the second portion 400b may be substantially straight or less curved. In some implementations, the first portion 400a and the second portion 400b are contiguous portions of the electromagnetic (EMI) shield 400.

The electromagnetic (EMI) shield 400 apply a load and compress the thermal interface material (TIM) 270 of the package 1200 in a similar manner as described in FIG. 4.

Figure 15:
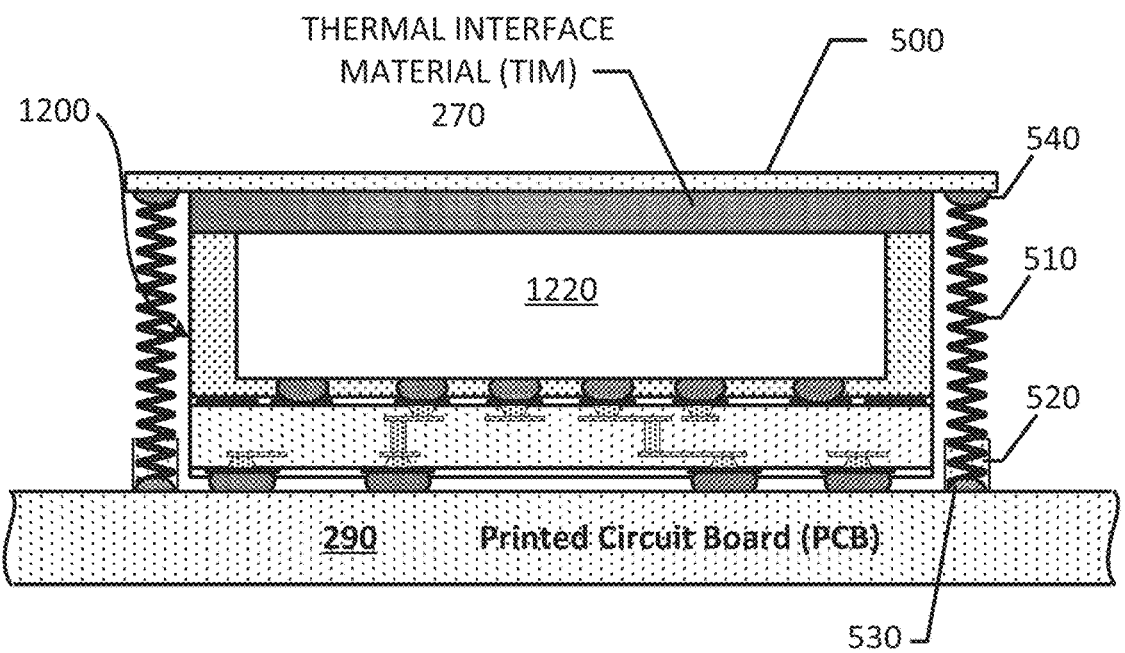
FIG. 15 illustrates a profile view of a package that includes a compressed thermal interface material (TIM) and an electromagnetic (EMI) shield.

FIG. 15 illustrates an electromagnetic (EMI) shield 500 (e.g., means for electromagnetic (EMI) shielding) that at least partially surrounds the package 1200. FIG. 15 illustrates the electromagnetic (EMI) shield 500 coupled to the PCB 290 through the use of at least one spring 510, a latch 520, a solder 530 and a solder 540. In some implementations, the at least one spring 510 may be part of the electromagnetic (EMI) shield 500.

The electromagnetic (EMI) shield 500 apply a load and compress the thermal interface material (TIM) 270 of the package 1200 in a similar manner as described in FIG. 5.

Figure 16:
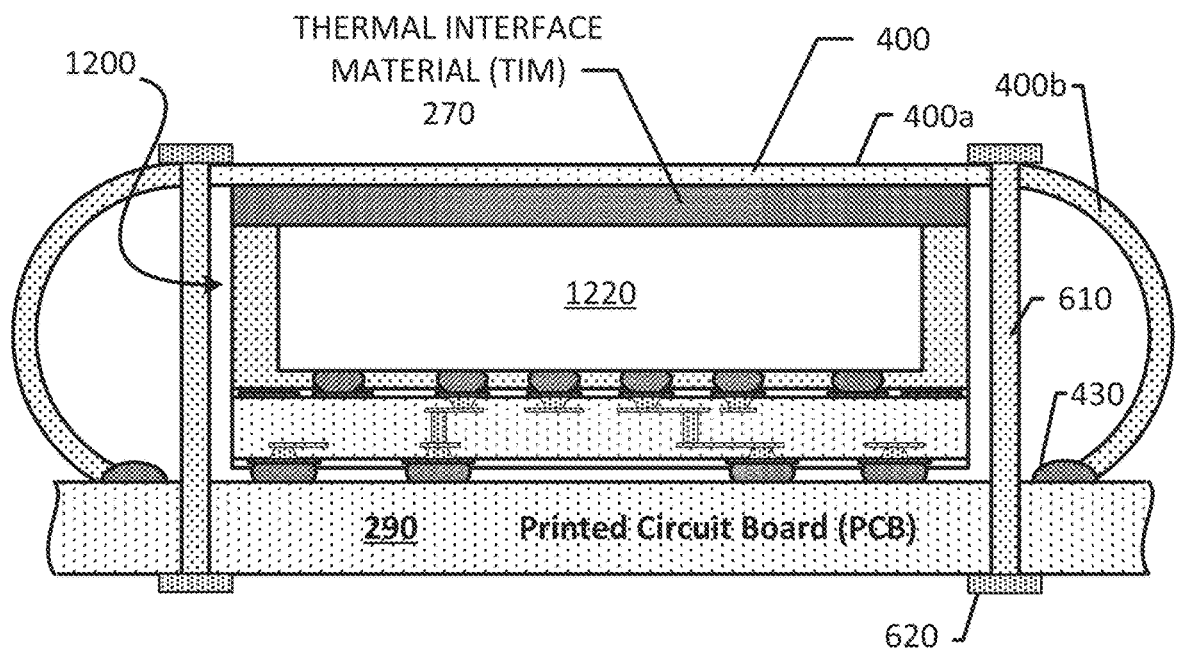
FIG. 16 illustrates a profile view of a package that includes a compressed thermal interface material (TIM) and an electromagnetic (EMI) shield.

FIG. 16 illustrates the electromagnetic (EMI) shield 400 (e.g., means for electromagnetic (EMI) shielding) that at least partially surrounds the package 1200. The configuration of the electromagnetic (EMI) shield 400 of FIG. 16 is similar to the configuration of the electromagnetic (EMI) shield 400 of FIG. 6. The electromagnetic (EMI) shield 400 is held down by at least one pin 610 and at least one nut 620. The at least one pin 610 passes through the electromagnetic (EMI) shield 400 and the PCB 290. The pin 610 may be a push pin. In some implementations, the pin 610 may include a screw, a bolt, and/or a nut.

Figure 17:
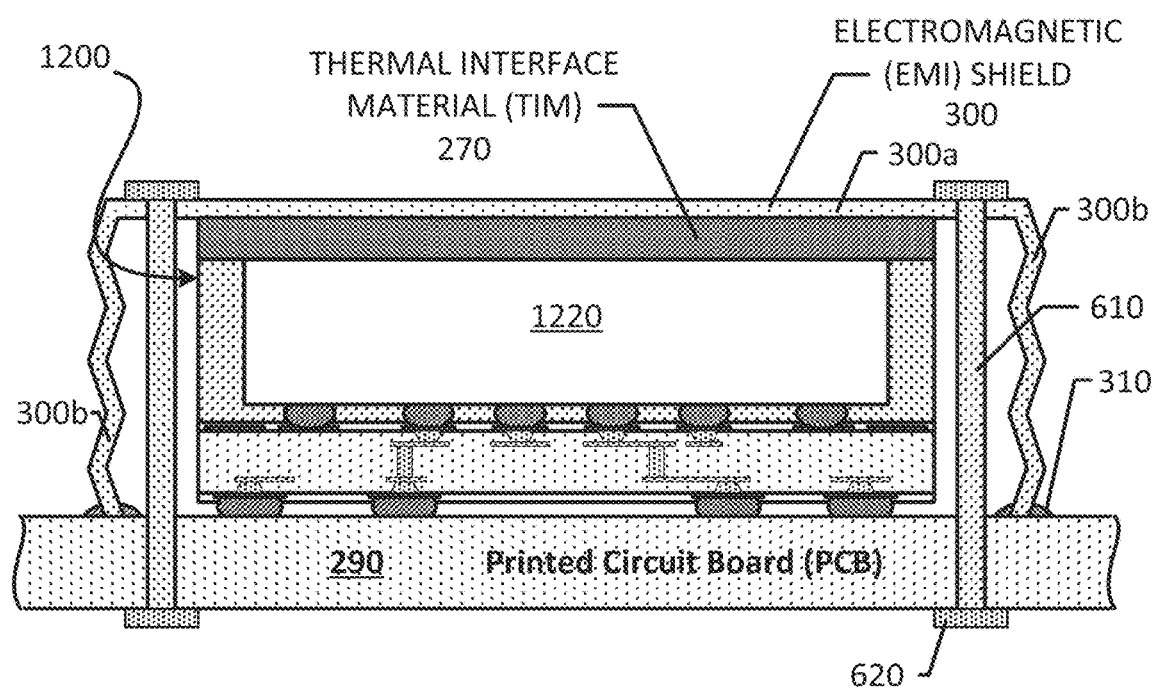
FIG. 17 illustrates a profile view of a package that includes a compressed thermal interface material (TIM) and an electromagnetic (EMI) shield.

FIG. 17 illustrates an electromagnetic (EMI) shield 300 (e.g., means for electromagnetic (EMI) shielding) that at least partially surrounds the package 1200. The configuration of the electromagnetic (EMI) shield 300 of FIG. 17 is similar to the configuration of the electromagnetic (EMI) shield 300 of FIG. 7. The electromagnetic (EMI) shield 300 is held down by at least one pin 610 and at least one nut 620. The at least one pin 610 passes through the electromagnetic (EMI) shield 400 and the PCB 290. The pin 610 may be a push pin. In some implementations, the pin 610 may include a screw, a bolt, and/or a nut.

Figure 18:
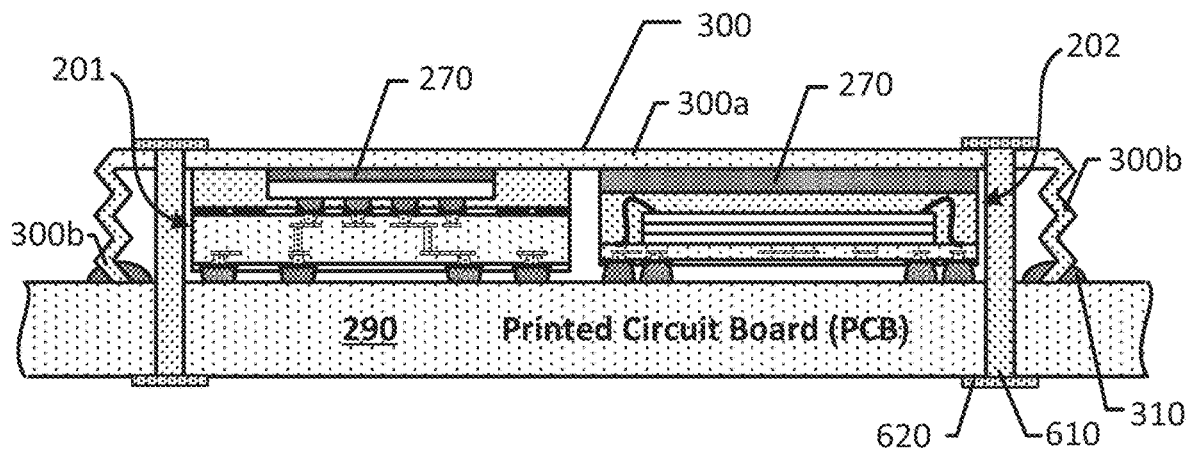
FIG. 18 illustrates a profile view of several packages, a compressed thermal interface material (TIM) and an electromagnetic (EMI) shield.
Figure 19:
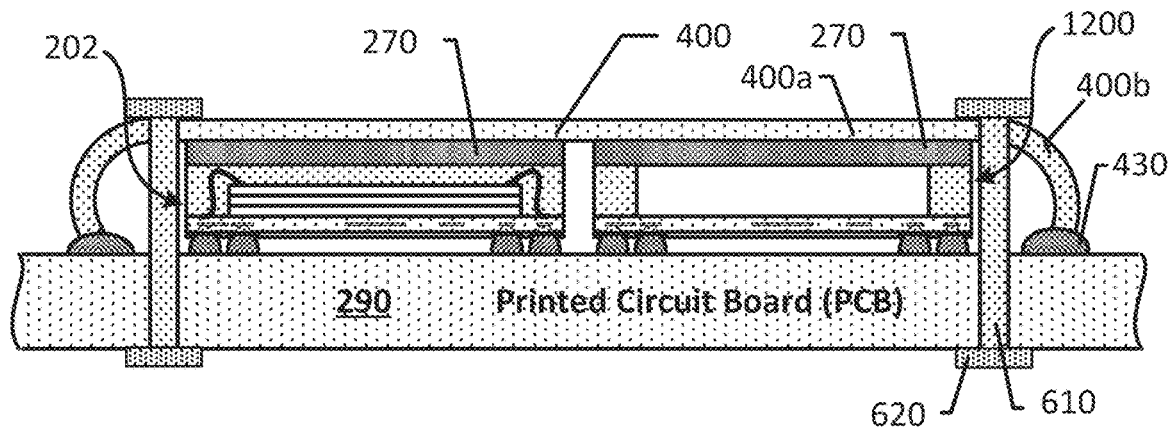
FIG. 19 illustrates a profile view of several packages, a compressed thermal interface material (TIM) and an electromagnetic (EMI) shield.
Figure 20:
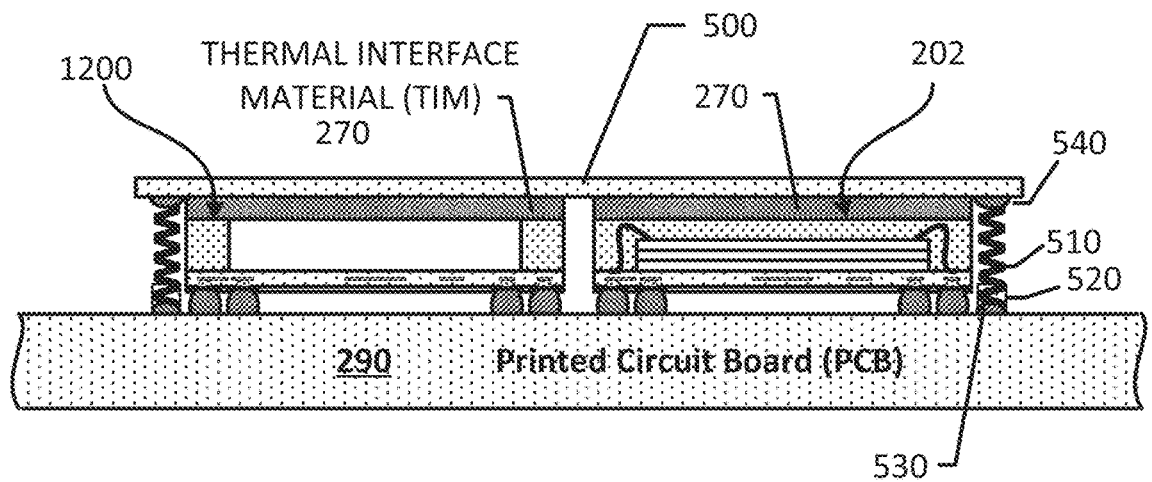
FIG. 20 illustrates a profile view of several packages, a compressed thermal interface material (TIM) and an electromagnetic (EMI) shield.

Exemplary Devices Comprising a Thermal Interface Material (TIM) and an Electromagnetic (EMI) Shield FIGS. 18-20 illustrate other configurations of devices that include a thermal interface material (TIM) and an electromagnetic (EMI) shield.

FIG. 18 illustrates a first package 201 and a second package 202 at least partially surrounded by the electromagnetic (EMI) shield 300. The first package 201 and the second package 202 are side by side to one another, and coupled to the PCB 290. As shown in FIG. 18, the electromagnetic (EMI) shield 300, the at least one pin 610, and/or the at least one nut 620 applies a load and compression to the thermal interface material (TIM) 270 over the first package 201 and the thermal interface material (TIM) 270 over the second package 202. The load and compression is applied in a similar manner as described in at least FIGS. 3 and 7.

FIG. 19 illustrates two packages (e.g., package 202, package 1002) at least partially surrounded by the electromagnetic (EMI) shield 400. Both packages are side by side to one another, and coupled to the PCB 290. As shown in FIG. 19, the electromagnetic (EMI) shield 400, the at least one pin 610 and/or the at least one nut 620 applies a load and compression to the thermal interface material (TIM) 270 over both packages (e.g., package 202, package 1002). The pressure and compression is applied in a similar manner as described in at least FIGS. 4 and 6.

FIG. 20 illustrates two packages (e.g., package 1002, package 202) at least partially surrounded by the electromagnetic (EMI) shield 500. Both packages are side by side to one another, and coupled to the PCB 290. As shown in FIG. 20, the electromagnetic (EMI) shield 500 and/or the at least one spring 510 applies a load and compression to the thermal interface material (TIM) 270 over both packages (e.g., package 1002, package 202). The load and compression is applied in a similar manner as described in at least FIG. 5.

It is noted that other configurations of packages, compressed thermal interface materials (TIMs) and electromagnetic (EMI) shields may be used. For example, more than one thermal interface material (TIM) may be used and/or different combinations of a thermal interface material (TIM) may be use. In some implementations, one, two or more dies, packages and/or PoP packages may be partially surrounded by the electromagnetic (EMI) shield. In some implementations, the compressed thermal interface material (TIM) and the electromagnetic (EMI) shield may be applicable and/or used with a bare die. In some implementations, the compressed thermal interface material (TIM) and/or the electromagnetic (EMI) shield may be used with other electronic components (e.g., passive device, capacitor). In addition, different implementations may use different means for coupling to secure the electromagnetic (EMI) shield to a substrate and/or a board (e.g., PCB). Examples of different means for coupling include a pin, a screw, a bolt, a nut, a latch, a wedge, and/or a spring. In some implementations, these means for coupling provide a load on the electromagnetic (EMI) shield, which then compresses the thermal interface material (TIM). In some implementations, the electromagnetic (EMI) shield is coupled (e.g., electrically coupled) to a ground reference.

Having described various devices, packages and/or package on package (PoP) devices that includes a compressed thermal interface material (TIM) and an electromagnetic (EMI) shield, various exemplary sequences for fabricating such packages and/or package on package (PoP) devices will now be described.

Figure 21A:
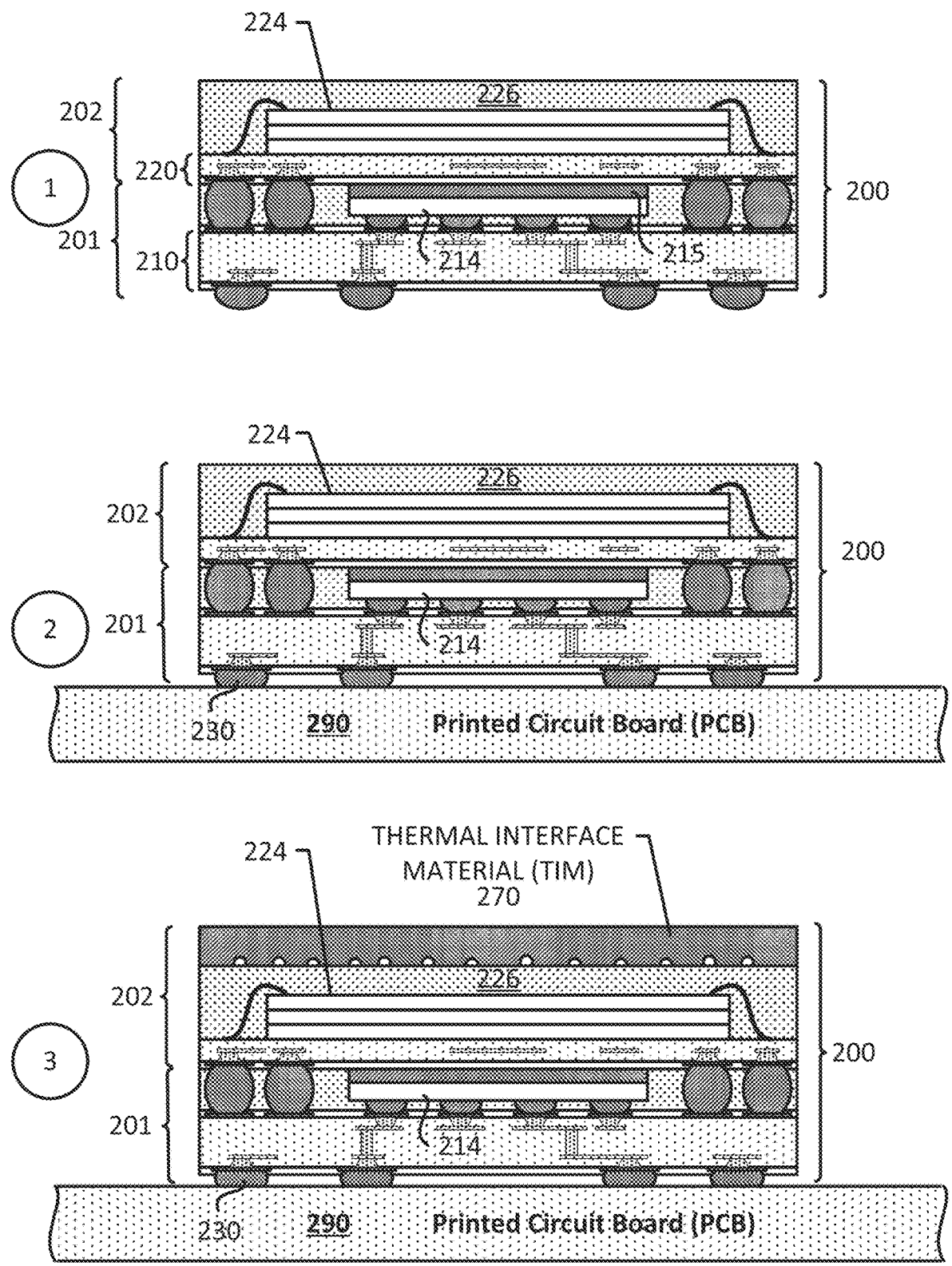
FIG. 21 (which includes FIGS. 21A-21B) illustrates an example of a sequence for fabricating a package on package (PoP) device that includes a compressed thermal interface material (TIM) and an electromagnetic (EMI) shield.
Figure 21B:
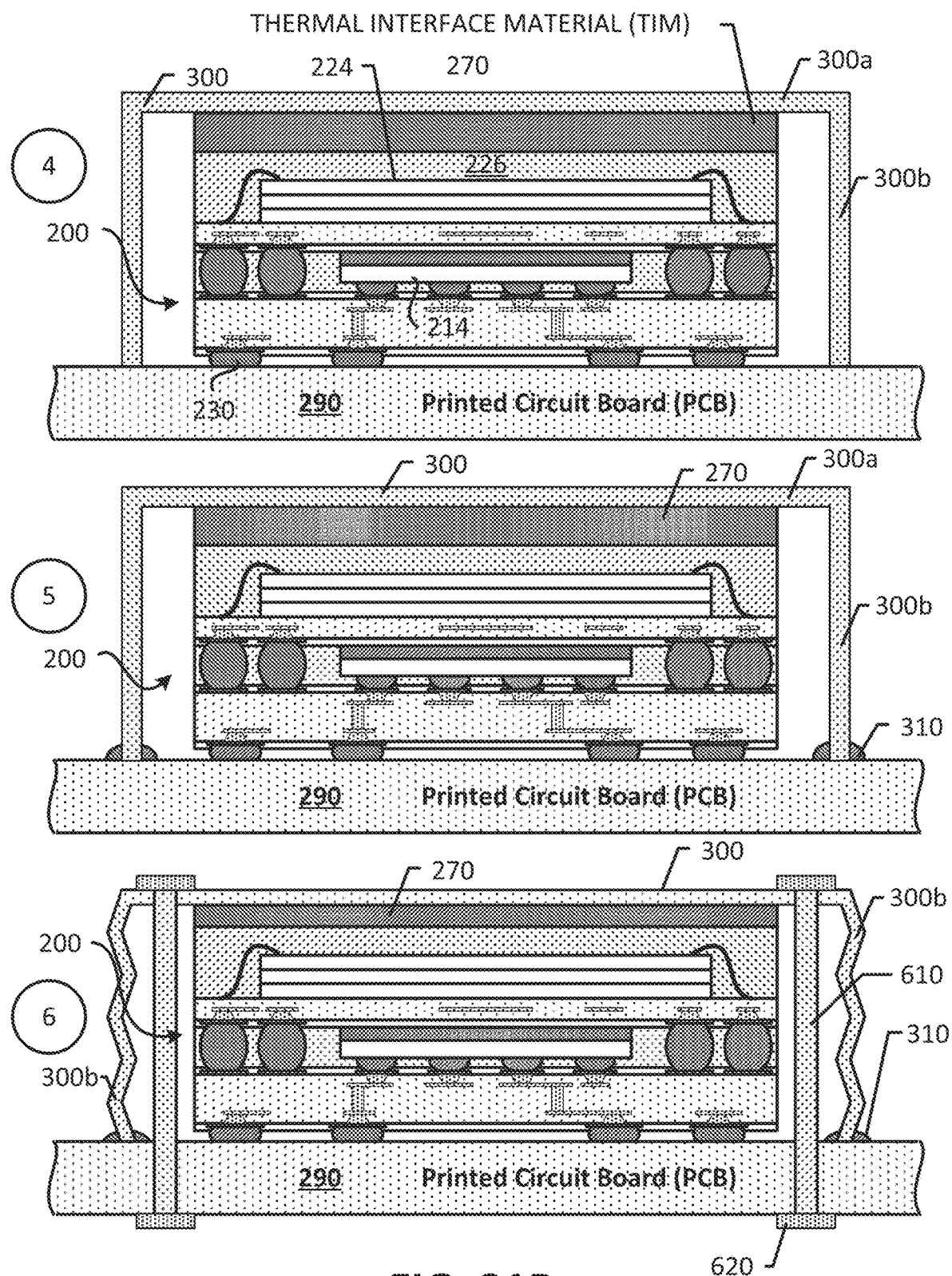

Exemplary Sequence for Fabricating a Device Comprising a Compressed Thermal Interface Material (TIM) and an Electromagnetic (EMI) Shield In some implementations, providing/fabricating a device that includes a compressed thermal interface material (TIM) includes several processes. FIG. 21 (which includes FIGS. 21A-21B) illustrates an exemplary sequence for providing/fabricating a package that includes a compressed thermal interface material (TIM). In some implementations, the sequence of FIGS. 21A-21B may be used to fabricate the package or package on package (PoP) device of FIGS. 3, 7, 18 and/or other devices described in the present disclosure. However, for the purpose of simplification, FIGS. 21A-21B will be described in the context of fabricating a package on package (PoP) device of FIG. 7.

It should be noted that the sequence of FIGS. 21A-21B may combine one or more stages in order to simplify and/or clarify the sequence for providing a package on package (PoP) device. In some implementations, the order of the processes may be changed or modified.

Stage 1, as shown in FIG. 21A, illustrates a state after the package on package (PoP) device 200 is provided (e.g., fabricated). The package on package (PoP) device 200 includes the first package 201 and the second package 202. The first package 201 includes the first package substrate 210, the first die 214. The second package 202 includes the second package substrate 220, the plurality of dies 224, the second encapsulation layer 226.

Stage 2 illustrates coupling the package on package (PoP) device 200 to a printed circuit board (PCB) 290 through the plurality of solder balls 230.

Stage 3 illustrates a state after the thermal interface material (TIM) 270 is provided over the second package 202. In particular, the thermal interface material (TIM) 270 is formed over the plurality of dies 224 and coupled to the second encapsulation layer 226. In some implementations, providing the thermal interface material (TIM) 270 may include forming the thermal interface material (TIM) 270 over the second package 202 and curing the thermal interface material (TIM) 270.

Stage 4, as shown in FIG. 21B, illustrates a state after an electromagnetic (EMI) shield 300 is provided over the package on package (PoP) device 200. The electromagnetic (EMI) shield 300 is provided such that the electromagnetic (EMI) shield 300 may or may not be in contact with the thermal interface material (TIM) 270. The electromagnetic (EMI) shield 300 includes a first portion 300a and a second portion 300b (e.g., flexible portion). The second portion 300b may be substantially straight, curved or in a zigzag pattern when there is no load on the electromagnetic (EMI) shield 300. At this stage, the thermal interface material (TIM) 270 may or may not be compressed. At this stage, the second portion 300b (e.g., flexible portion) may or may not be straight, depending on whether there is a load or not.

Stage 5 illustrates a state after solder 310 is used to couple the electromagnetic (EMI) shield 300 to the printed circuit board (PCB) 290. At this stage, the thermal interface material (TIM) 270 may or may not be compressed. At this stage, the second portion 300b (e.g., flexible portion) may or may not be straight (e.g., depending on whether there is a load or not).

Stage 6 illustrates a state after the electromagnetic (EMI) shield 300 is coupled to the PCB 290 through the use of the pin 610 and the nut 320. The process of coupling the electromagnetic (EMI) shield 300 to the PCB 290 applies a load to the thermal interface material (TIM) 270 and compresses the thermal interface material (TM) 270. This results in the elimination, minimization, or reduction of the air gaps between the thermal interface material (TIM) 270 and a contact surface (e.g., surface of the electromagnetic (EMI) shield 300, surface of the die, surface of the encapsulation layer, surface of package). Examples of loads and compressions that can be used were previously described above in the present disclosure.

Figure 22:
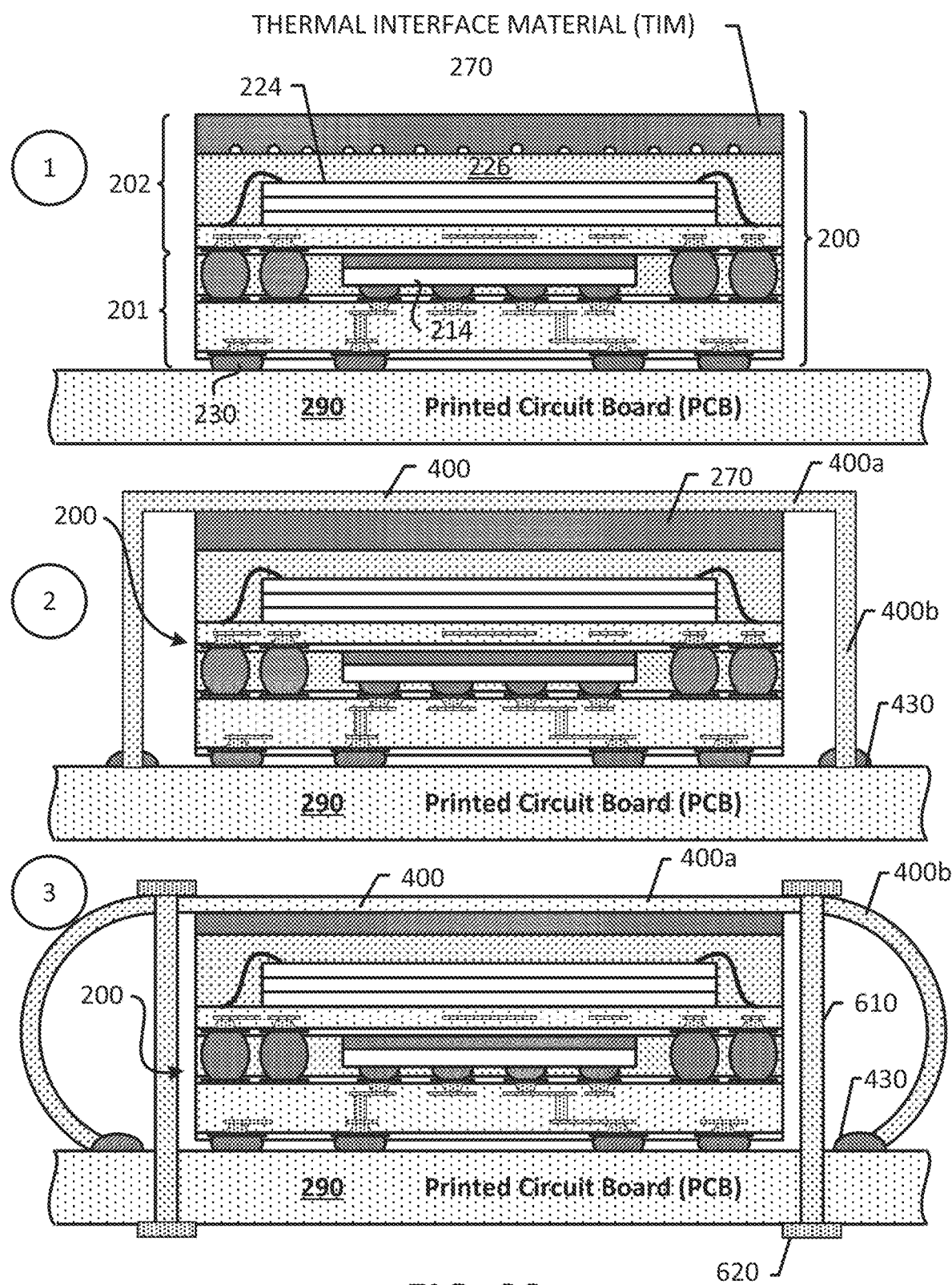
FIG. 22 illustrates an example of a sequence for fabricating a package on package (PoP) device that includes a compressed thermal interface material (TIM) and an electromagnetic (EMI) shield.

Exemplary Sequence for Fabricating a Device Comprising a Compressed Thermal Interface Material (TIM) and an Electromagnetic (EMI) Shield In some implementations, providing/fabricating a device that includes a compressed thermal interface material (TIM) includes several processes. FIG. 22 illustrates an exemplary sequence for providing/fabricating a package that includes a compressed thermal interface material (TIM). In some implementations, the sequence of FIG. 22 may be used to fabricate the package or package on package (PoP) device of FIGS. 4, 6, 19 and/or other devices described in the present disclosure. However, for the purpose of simplification, FIG. 22 will be described in the context of fabricating a package on package (PoP) device 200 of FIG. 6.

It should be noted that the sequence of FIG. 22 may combine one or more stages in order to simplify and/or clarify the sequence for providing a package on package (PoP) device. In some implementations, the order of the processes may be changed or modified.

Stage 1, illustrates a state after the package on package (PoP) device 200 is provided (e.g., fabricated). The package on package (PoP) device 200 includes the first package 201 and the second package 202. The first package 201 includes the first package substrate 210, the first die 214. The second package 202 includes the second package substrate 220, the dies 224, the second encapsulation layer 226 and the thermal interface material (TIM) 270. The thermal interface material (TIM) 270 is provided over the second package 202. In particular, the thermal interface material (TIM) 270 is formed over and coupled to the dies 224. In some implementations, providing the thermal interface material (TIM) 270 may include forming the thermal interface material (TIM) 270 over the second package 202 and curing the thermal interface material (TIM) 270.

Stage 1 also illustrates the package on package (PoP) device 200 coupled to a printed circuit board (PCB) 290 through the plurality of solder balls 230.

Stage 2 illustrates a state after an electromagnetic (EMI) shield 400 is provided over the package on package (PoP) device 200. The electromagnetic (EMI) shield 400 is provided such that the electromagnetic (EMI) shield 400 is in contact with the thermal interface material (TIM) 270. The electromagnetic (EMI) shield 400 includes a first portion 400a and a second portion 400b (e.g., flexible portion). The second portion 400b may be substantially straight or curved when there is no load on the electromagnetic (EMI) shield 300. At this stage, the thermal interface material (TIM) 270 may or may not be compressed. The electromagnetic (EMI) shield 400 is coupled to the PCB 290 through a solder 430.

Stage 3 illustrates a state after the electromagnetic (EMI) shield 400 is coupled to the PCB 290 through the use of the pin 610 and the nut 320. The process of coupling the electromagnetic (EMI) shield 400 to the PCB 290 applies a load to the thermal interface material (TIM) 270 and compresses the thermal interface material (TM) 270. This results in the elimination, minimization, or reduction of the air gaps between the thermal interface material (TIM) 270 and a contact surface (e.g., surface of the electromagnetic (EMI) shield 400, surface of the die, surface of the encapsulation layer, surface of package).

Figure 23:
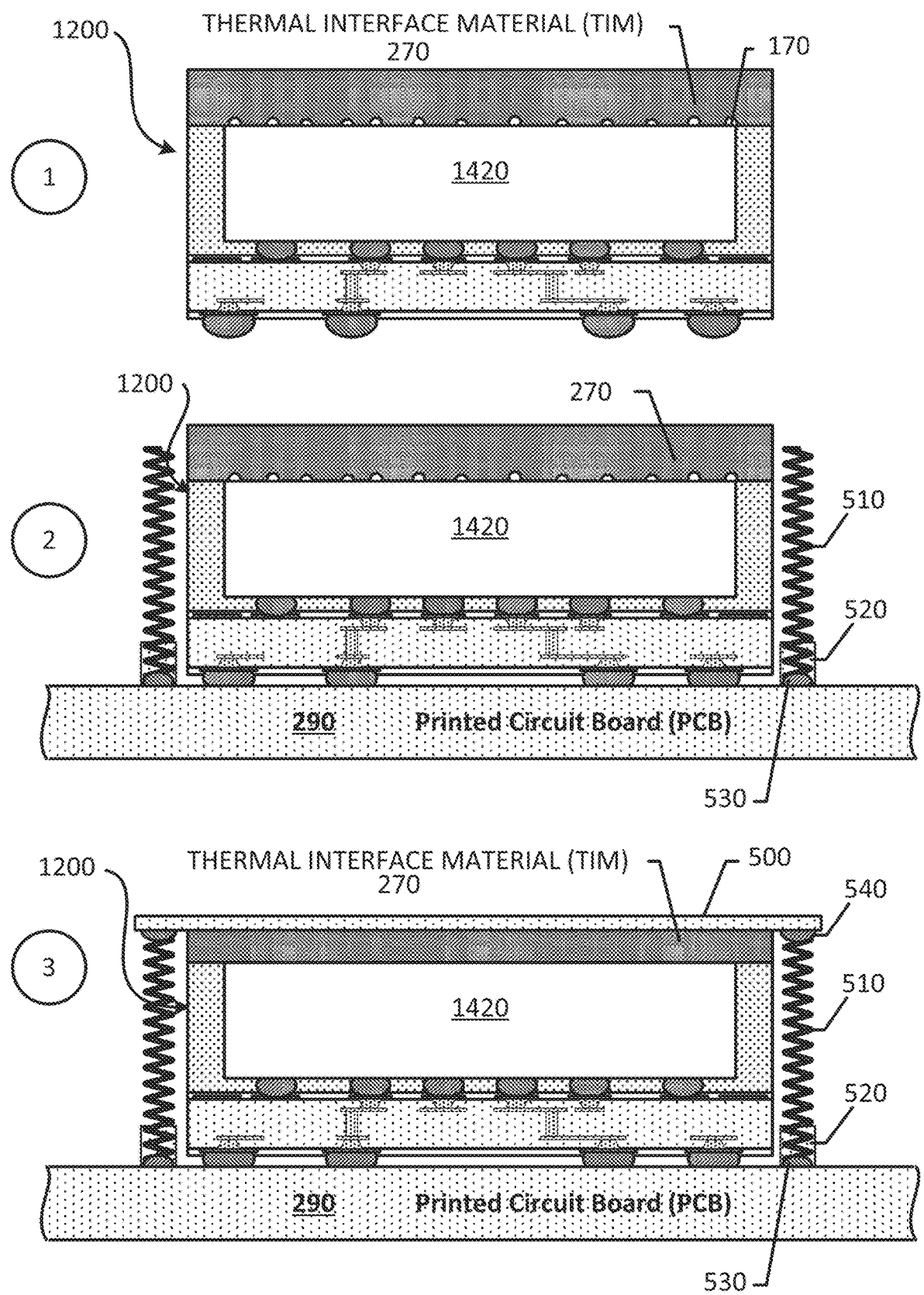
FIG. 23 illustrates an example of a sequence for fabricating a package that includes a compressed thermal interface material (TIM) and an electromagnetic (EMI) shield.

Exemplary Sequence for Fabricating a Device Comprising a Compressed Thermal Interface Material (TIM) and an Electromagnetic (EMI) Shield In some implementations, providing/fabricating a device that includes a compressed thermal interface material (TIM) includes several processes. FIG. 23 illustrates an exemplary sequence for providing/fabricating a package that includes a compressed thermal interface material (TIM). In some implementations, the sequence of FIG. 23 may be used to fabricate the package or package on package (PoP) device of FIGS. 5, 15, 20 and/or other devices described in the present disclosure. However, for the purpose of simplification, FIG. 23 will be described in the context of fabricating a package of FIG. 15.

It should be noted that the sequence of FIG. 23 may combine one or more stages in order to simplify and/or clarify the sequence for providing a package. In some implementations, the order of the processes may be changed or modified.

Stage 1, illustrates a state after the package 1200 is provided (e.g., fabricated). The package 1200 includes the package substrate 1202, the die 1220. The package 1200 includes the thermal interface material (TIM) 270. The thermal interface material (TIM) 270 is provided over the package 1200. In particular, the thermal interface material (TIM) 270 is formed over and coupled to the die 1220. In some implementations, providing the thermal interface material (TIM) 270 may include forming the thermal interface material (TIM) 270 over the package 1200 and curing the thermal interface material (TIM) 270.

Stage 2, illustrates a state after the package 1200 is coupled to a printed circuit board (PCB) 290 through the plurality of solder balls 230. Stage 2 also illustrates a latch 520, the at least one spring 510 and the solder 530 being provided over the PCB 290.

Stage 3 illustrates a state after the electromagnetic (EMI) shield 500 is coupled to the at least one spring 510 through a solder 540. The electromagnetic (EMI) shield 500 is provided such that the electromagnetic (EMI) shield 500 is in contact with the thermal interface material (TIM) 270. At this stage, the thermal interface material (TIM) 270 may or may not be compressed.

When a load is applied to the electromagnetic (EMI) shield 500, the thermal interface material (TIM) 270 is compressed. This results in the elimination, minimization, or reduction of the air gaps between the thermal interface material (TIM) 270 and a contact surface (e.g., surface of the electromagnetic (EMI) shield 500, surface of the die, surface of the encapsulation layer, surface of package).

Having described several sequences of several processes for fabricating a package that includes a compressed thermal interface material and an electromagnetic (EMI) shield, a method for fabricating a package that includes a compressed thermal interface material and an electromagnetic (EMI) shield will now be described below.

Figure 24:
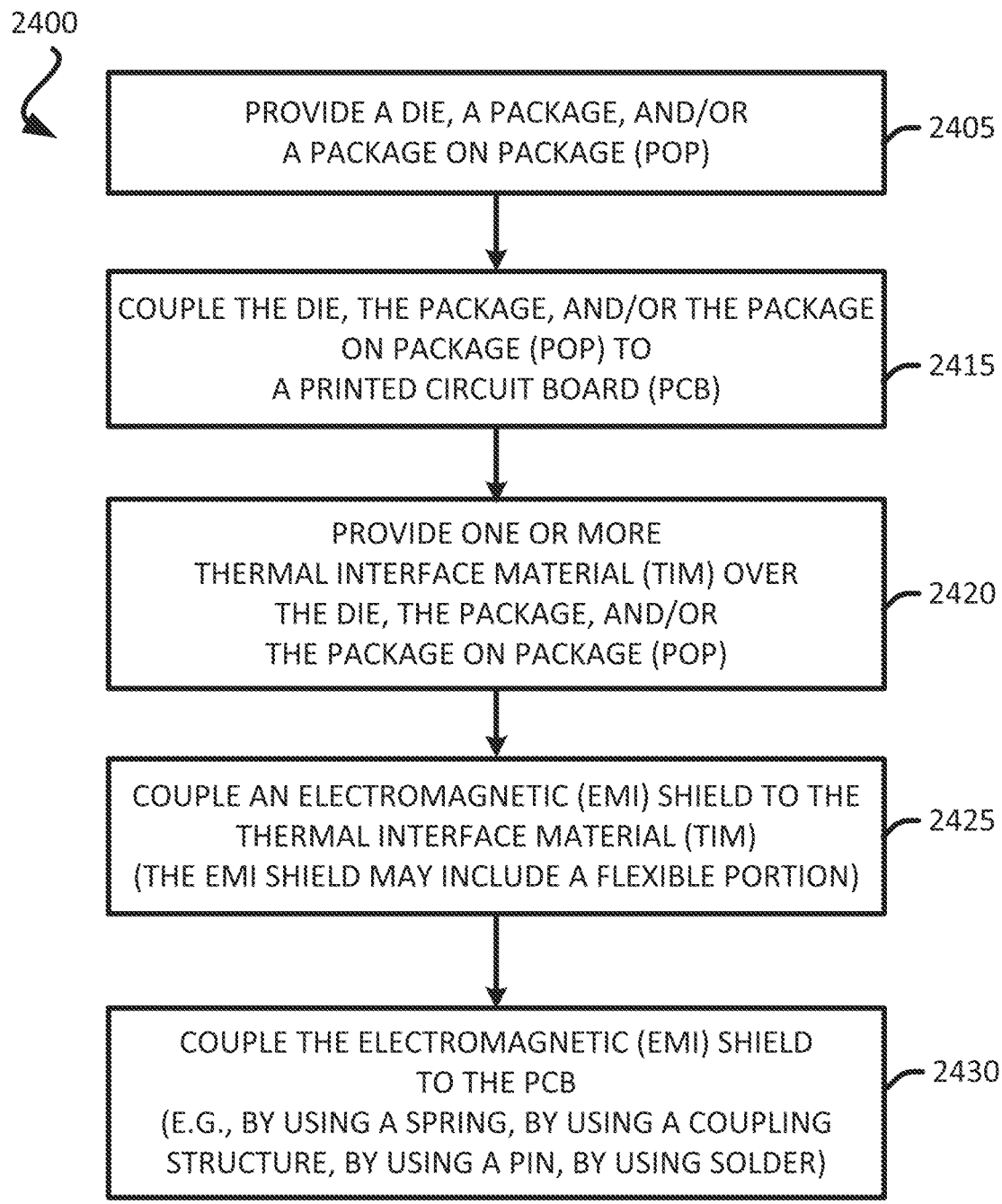
FIG. 24 illustrates a flow diagram of an exemplary method for fabricating a device that includes a compressed thermal interface material (TIM) and an electromagnetic (EMI) shield.

Exemplary Method for Fabricating a Device Comprising a Compressed Thermal Interface Material (TIM) and an Electromagnetic (EMI) Shield In some implementations, providing/fabricating a device that includes a compressed thermal interface material (TIM) includes several processes. FIG. 24 illustrates an exemplary flow diagram of a process for providing/fabricating a package that includes a compressed thermal interface material (TIM). In some implementations, the flow diagram of FIG. 24 may be used to fabricate the package or package on package (PoP) device of FIGS. 2-20 and/or other devices described in the present disclosure. However, for the purpose of simplification, FIG. 24 will be described in the context of fabricating a package on package (PoP) device of FIG. 3.

It should be noted that the flow diagram of FIG. 24 may combine one or more processes in order to simplify and/or clarify the method for providing a package on package (PoP) device. In some implementations, the order of the processes may be changed or modified.

The method provides (at 2405) a die, a package and/or a package on package (PoP) device. Stage 1 of FIG. 21A illustrates an example of providing a package on package (PoP) device (e.g., 200). The package on package (PoP) device 200 includes the first package 201 and the second package 202. In some implementations, providing the die, the package and/or the package on package (PoP) device may include fabricating the die, the package, and/or the package on package (PoP) device.

The method provides (at 2410) a thermal interface material (TIM) (e.g., 270) over the die, the package, and/or the package on package (PoP) device. Stage 2 of FIG. 21A illustrates an example of providing a thermal interface material (TIM) over the second package 202. In some implementations, the thermal interface material (TIM) 270 is formed over a plurality of dies and coupled to an encapsulation layer. In some implementations, providing the thermal interface material (TIM) 270 may include forming the thermal interface material (TIM) 270 over the second package 202 and curing the thermal interface material (TIM) 270.

The method couples (at 2415) the die, the package, and/or the package on package (PoP) device (e.g., 200) to a printed circuit board (PCB) (e.g., 290).

The method couples (at 2420) an electromagnetic (EMI) shield (e.g., 300) to the thermal interface material (TIM). The electromagnetic (EMI) shield 300 is provided such that the electromagnetic (EMI) shield 300 is in contact with the thermal interface material (TIM) 270. The electromagnetic (EMI) shield 300 may include a flexible portion (e.g., zigzag pattern, curved). In some implementations, the electromagnetic (EMI) shield may include at least one spring. At this stage, the thermal interface material (TIM) 270 may or may not be compressed.

The method couples (at 2425) the electromagnetic (EMI) shield 300 to the PCB 290. Different implementations may couple to the electromagnetic (EMI) to the PCB 290 by using different coupling structures or mechanism. Examples of different coupling structures include, a spring, a pin, a latch, a gasket, as illustrated and described in FIGS. 3-17. The process of coupling the electromagnetic (EMI) shield 300 to the PCB 290 applies pressure to the thermal interface material (TIM) 270 and compresses the thermal interface material (TM) 270. This results in the elimination, minimization, or reduction of the air gaps between the thermal interface material (TIM) 270 and a contact surface (e.g., surface of the electromagnetic (EMI) shield 300, surface of the die, surface of the encapsulation layer, surface of package).

Exemplary Electronic Devices

Figure 25:
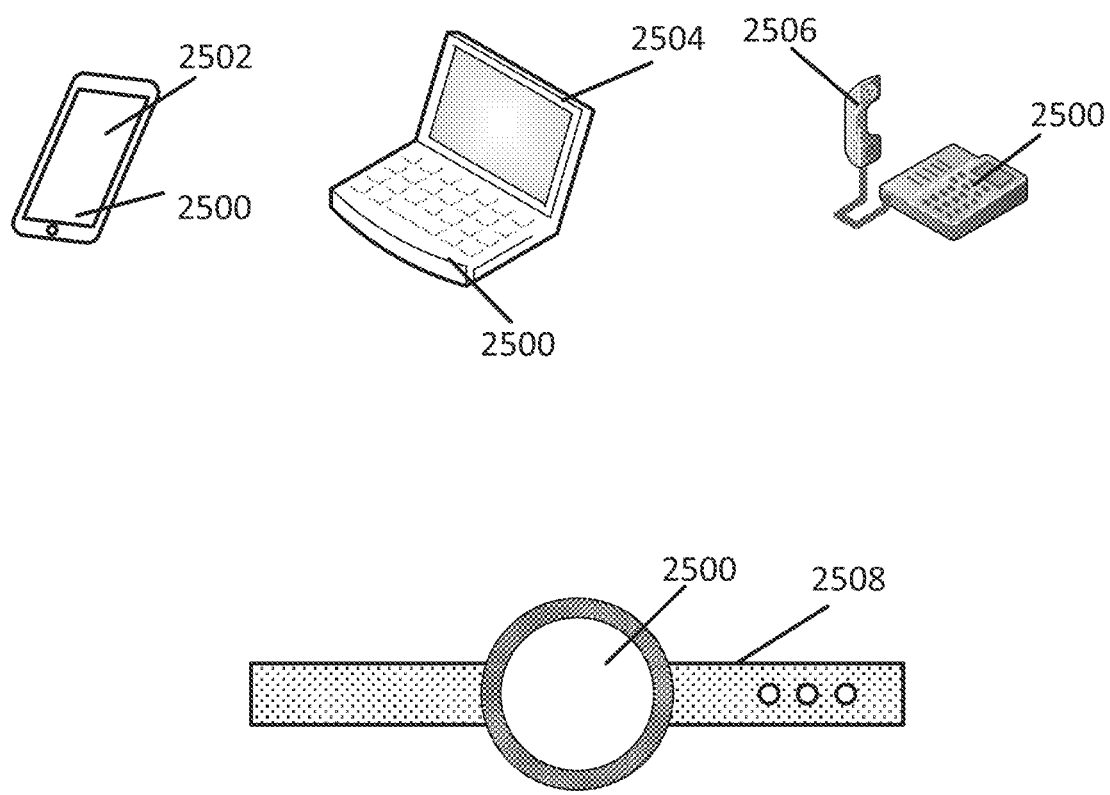
FIG. 25 illustrates various electronic devices that may include the various integrated devices, integrated device packages, semiconductor devices, dies, integrated circuits, and/or packages described herein.

FIG. 25 illustrates various electronic devices that may be integrated with any of the aforementioned device, integrated device, semiconductor device, integrated circuit, die, interposer, package or package-on-package (PoP). For example, a mobile phone device 2502, a laptop computer device 2504, a fixed location terminal device 2506, or a wearable device 2508 may include a device 2500 as described herein. The device 2500 may be, for example, any of the devices described herein. The devices 2502, 2504, 2506, and 2508 illustrated in FIG. 25 are merely exemplary. Other electronic devices may also feature the device 2500 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-20, 21A-21B, and/or 22-25 may be rearranged and/or combined into a single component, process, feature or function or embodied in several components, processes, or functions. Additional elements, components, processes, and/or functions may also be added without departing from the disclosure. It should also be noted FIGS. 2-20, 21A-21B, and/or 22-25 and its corresponding description in the present disclosure is not limited to dies and/or ICs. In some implementations, FIGS. 2-20, 21A-21B, and/or 22-25 and its corresponding description may be used to manufacture, create, provide, and/or produce devices and/or integrated devices. In some implementations, a device may include a die, an integrated device, a die package, an integrated circuit (IC), a device package, an integrated circuit (IC) package, a wafer, a semiconductor device, a package-on-package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A device comprising:
   a die;
   a thermal interface material (TIM) provided over the die;
   an electromagnetic (EMI) shield coupled to the thermal interface material (TIM),
      wherein the electromagnetic (EMI) shield is configured to be coupled to ground,
      wherein the electromagnetic (EMI) shield comprises a first portion and a collapsible portion,
      wherein the collapsible portion includes the same material as the first portion, the collapsible portion is a vertical flexible portion configured to flex vertically,
      wherein the electromagnetic (EMI) shield is configured to compress the thermal interface material (TIM), and
   a board coupled to the electromagnetic (EMI) shield through a solder.

2. The device of claim 1, wherein the collapsible portion of the electromagnetic (EMI) shield comprises a stiffness that will result in a displacement in a range of about 50-500 micrometers when a load in a range of 2-90 Newtons (N) is applied to the electromagnetic (EMI) shield.

3. The device of claim 1, wherein the thermal interface material (TIM) is compressed by the electromagnetic (EMI) shield such that the thickness of the thermal interface material (TIM) is reduced by about at least 10~20 percent.

4. The device of claim 1, wherein the electromagnetic (EMI) shield is coupled to a spring.

5. The device of claim 1, wherein the electromagnetic (EMI) shield is coupled to a pin, to provide a load that compresses the thermal interface material (TIM).

6. The device of claim 1, wherein the die is part of a package and/or a package on package (PoP).

7. The device of claim 1, wherein the device is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

8. The device of claim 1,
   wherein the first portion and the collapsible portion are continuous portions,
   wherein the collapsible portion is configured to comprise a particular shape,
   wherein the collapsible portion is further configured to collapse under a load such that the collapsible portion comprises another shape,
   wherein the collapsible portion is further configured to not comprise the particular shape when the load is removed from the collapsible portion,
   wherein the first portion is directly touching the thermal interface material (TIM), and
   wherein at least part of the collapsible portion is located laterally to the die.

9. The device of claim 1,
   wherein the electromagnetic (EMI) shield is configured to directly compress the thermal interface material (TIM), and
   wherein the first portion and the collapsible portion have a same thickness.

10. The device of claim 1,
    wherein the vertical flexible portion is perpendicular to the first portion and parallel to the die through an entire vertical length of the die.

11. An apparatus comprising:
    a die;
    a thermal interface material (TIM) provided over the die;
    means for electromagnetic (EMI) shielding directly coupled to the thermal interface material (TIM), the means for electromagnetic (EMI) shielding comprising a flexible portion,
       wherein the means for electromagnetic (EMI) shielding is configured to be coupled to ground,
       wherein the means for electromagnetic (EMI) shielding is configured to directly compress the thermal interface material (TIM),
       wherein the flexible portion comprises a vertical flexible portion that is configured to flex vertically, and
    a board coupled to the means for electromagnetic (EMI) shielding through a solder.

12. The apparatus of claim 11, wherein the flexible portion of the means for electromagnetic (EMI) shielding comprises a stiffness that will result in a displacement in a range of about 50-500 micrometers when a load in a range of 2-90 Newtons (N) is applied to the means for electromagnetic (EMI) shielding.

13. The apparatus of claim 11, wherein the thermal interface material (TIM) is compressed by the means for electromagnetic (EMI) shielding such that the thickness of the thermal interface material (TIM) is reduced by about at least 10~20 percent.

14. The apparatus of claim 11, wherein the means for electromagnetic (EMI) shielding is coupled to a spring.

15. The apparatus of claim 11, wherein the means for electromagnetic (EMI) shielding is coupled to a pin means to provide a load that compresses the thermal interface material (TIM).

16. The apparatus of claim 11, wherein the apparatus is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

17. A device comprising:
   a die;
   a thermal interface material (TIM) provided over the die;
   an electromagnetic (EMI) shield coupled to the thermal interface material (TIM),
      wherein the electromagnetic (EMI) shield is configured to be coupled to ground,
      wherein the electromagnetic (EMI) shield comprises a first portion and a flexible portion,
      wherein the first portion and the flexible portion are contiguous,
      wherein the flexible portion includes a collapsible portion,
      wherein the first portion is coupled to the thermal interface material (TIM) and the flexible portion is located laterally to a side of the die,
      wherein the flexible portion comprises a stiffness in a range of about 40,000-180,000 Newtons/meter (N/m),
      wherein the flexible portion comprises a vertical flexible portion that is configured to flex vertically, the vertical flexible portion is perpendicular to the first portion and parallel to the die through an entire vertical length of the die,
      wherein the electromagnetic (EMI) shield is configured to compress the thermal interface material (TIM); and
   a board coupled to the electromagnetic (EMI) shield through a solder interconnect.

18. The device of claim 17, wherein the flexible portion of the electromagnetic (EMI) shield comprises a stiffness that will result in a displacement in a range of about 50-500 micrometers when a load in a range of 2-90 Newtons (N) is applied to the electromagnetic (EMI) shield.

19. The device of claim 17, wherein the thermal interface material (TIM) is compressed by the electromagnetic (EMI) shield such that the thickness of the thermal interface material (TIM) is reduced by about at least 10~20 percent.

20. The device of claim 17, wherein the electromagnetic (EMI) shield is coupled to a pin, to provide a load that compresses the thermal interface material (TIM).

21. The device of claim 17,
   wherein the first portion and the flexible portion include a continuous uniform material, and
   wherein the first portion and the flexible portion have a same thickness.

* * * * *